United States Patent [19]
Pfister et al.

[11] Patent Number: 6,032,476
[45] Date of Patent: *Mar. 7, 2000

[54] ELECTRONIC DEVICE COOLING APPARATUS

[75] Inventors: Dennis M. Pfister, Conway; Charles M. Byrd, Maumelle, both of Ark.

[73] Assignee: Sun Microsystems, Inc., Palo Alto, Calif.

[*] Notice: This patent is subject to a terminal disclaimer.

[21] Appl. No.: 09/203,156

[22] Filed: Dec. 1, 1998

Related U.S. Application Data

[60] Division of application No. 08/821,258, Mar. 20, 1997, Pat. No. 5,855,119, which is a continuation-in-part of application No. 08/811,759, Mar. 6, 1997, Pat. No. 5,855,121, which is a continuation of application No. 08/533,153, Sep. 20, 1995, abandoned.

[51] Int. Cl.[7] .................................................... F25D 23/12
[52] U.S. Cl. ............................................. 62/259.2; 62/515
[58] Field of Search .................................. 62/259.2, 480, 62/497, 476, 101, 515, 516; 361/695, 700

[56] References Cited

U.S. PATENT DOCUMENTS

| | | |
|---|---|---|
| 1,877,536 | 9/1932 | Ruckelshaus et al. . |
| 1,881,568 | 10/1932 | Henney .................................. 62/480 |
| 2,138,685 | 11/1938 | Altenkirch . |
| 2,326,130 | 8/1943 | Kleen ..................................... 62/179 |
| 2,338,712 | 1/1944 | Kleen ..................................... 62/480 |
| 2,384,460 | 9/1945 | Kleen ..................................... 62/118 |
| 2,496,459 | 2/1950 | Kleen ......................................... 62/5 |
| 2,624,182 | 1/1953 | Gross ..................................... 62/118 |
| 4,312,640 | 1/1982 | Verrando ................................. 55/33 |
| 4,312,641 | 1/1982 | Verrando et al. ...................... 55/33 |
| 4,399,341 | 8/1983 | Yasuoka . |
| 4,571,473 | 2/1986 | Wyslouzil et al. . |
| 4,581,049 | 4/1986 | Januschkowetz ................... 62/480 |
| 4,742,868 | 5/1988 | Mitani et al. .................... 165/104.12 |
| 4,884,626 | 12/1989 | Filipowski . |
| 4,889,965 | 12/1989 | Gervais et al. . |
| 4,928,207 | 5/1990 | Chrysler et al. . |
| 4,944,159 | 7/1990 | Crozat .................................... 62/112 |
| 4,976,117 | 12/1990 | Crozat et al. ......................... 62/480 |
| 5,021,620 | 6/1991 | Inumada . |

(List continued on next page.)

FOREIGN PATENT DOCUMENTS

| | | |
|---|---|---|
| 0 037 643 A1 | 10/1981 | European Pat. Off. . |
| 0 091 382 A1 | 10/1983 | European Pat. Off. . |
| 2 651 621 A1 | 3/1991 | France . |
| 2666141 | 2/1992 | France ......................... F25B 27/00 |
| 2 689 220 A1 | 10/1993 | France . |
| 2 703 763 A1 | 10/1994 | France . |
| 2 736 421 A1 | 1/1997 | France . |
| 2 604 100 A1 | 12/1998 | France . |
| 4113042 | 10/1992 | Germany ..................... F25B 30/04 |
| WO/97/11323 | 3/1997 | WIPO . |

OTHER PUBLICATIONS

Buffington, R.M., *Absorption Refrigeration with Solid Absorbents*, Sep. 1993, 7 pages, Electrolux Servel Laboratories, New York, N.Y.

Vasiliev, L. et al., *Waste Heat Driven Solid Sorption Coolers*, Date Unknown, 9 pages.

Iloeje, O.C., *Design Construction and Test Run of a Solar Powered Solid Absorption Refrigerator*, Sep. 6, 1984, pp. 447–455, Pergamon Press Ltd., U.S.A.

*Primary Examiner*—William Doerrler
*Attorney, Agent, or Firm*—Conley, Rose & Tayon, P.C.; Mark L. Berrier

[57] ABSTRACT

An apparatus for cooling an electrical component is disclosed which comprises a sorber containing a sorbent; a condenser in fluid communication with the sorber; an evaporator in fluid communication with both the sorber and the condenser and connected in heatexchange relation to the electrical component; wherein a sorbate which has been condensed in the condenser is evaporated in the evaporator, thereby absorbing heat from the electrical component, and then adsorbed onto the sorbent; an electromagnetic wave generator; a waveguide coupler for directing the electromagnetic waves to the sorbent; wherein the sorbate is desorbed from the sorbent by the electromagnetic waves and condensed in the condenser; and wherein the desorption of the sorbate from the sorbent is substantially isothermal.

3 Claims, 20 Drawing Sheets

U.S. PATENT DOCUMENTS

| | | | |
|---|---|---|---|
| 5,025,635 | 6/1991 | Rockenfeller et al. | 62/106 |
| 5,027,607 | 7/1991 | Rockenfeller et al. | 62/106 |
| 5,088,302 | 2/1992 | Tomizawa et al. . | |
| 5,161,389 | 11/1992 | Rockenfeller et al. | 62/480 |
| 5,165,247 | 11/1992 | Rockenfeller et al. | 62/77 |
| 5,179,259 | 1/1993 | Martin | 219/10.55 A |
| 5,216,327 | 6/1993 | Myers et al. . | |
| 5,220,804 | 6/1993 | Tilton et al. . | |
| 5,222,543 | 6/1993 | Carlstrom et al. . | |
| 5,223,809 | 6/1993 | Myer . | |
| 5,227,598 | 7/1993 | Woodmansee et al. . | |
| 5,271,239 | 12/1993 | Rockenfeller et al. | 62/259.2 |
| 5,274,347 | 12/1993 | Bobadilla . | |
| 5,291,942 | 3/1994 | Ryan | 62/480 |
| 5,300,901 | 4/1994 | Krümmel et al. . | |
| 5,333,471 | 8/1994 | Yamada | 62/476 |
| 5,442,931 | 8/1995 | Ryan et al. | 62/101 |
| 5,490,398 | 2/1996 | Cline | 62/497 |
| 5,522,452 | 6/1996 | Mizuno et al. . | |
| 5,855,119 | 1/1999 | Pfister et al. | 62/259.2 |

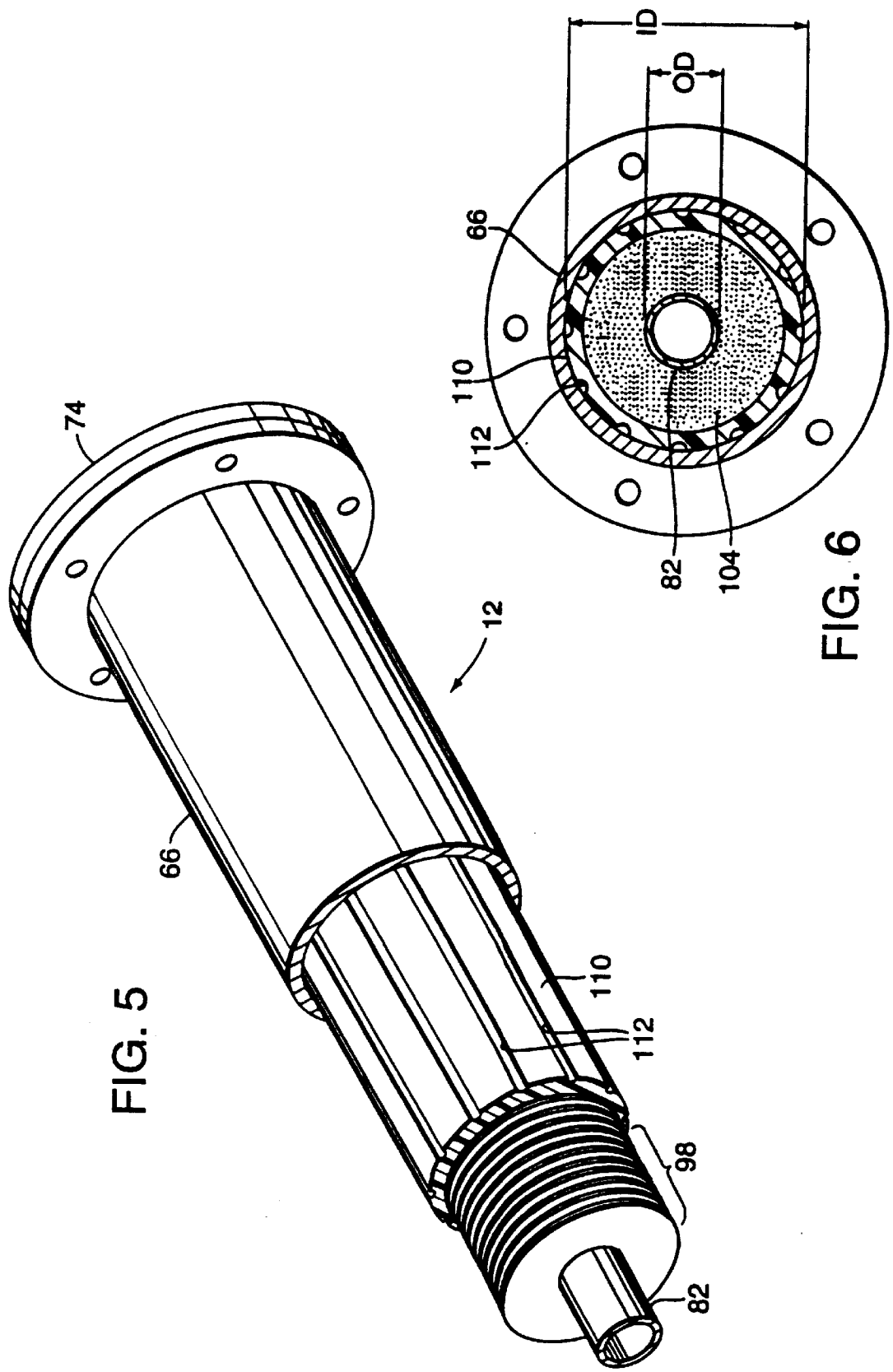

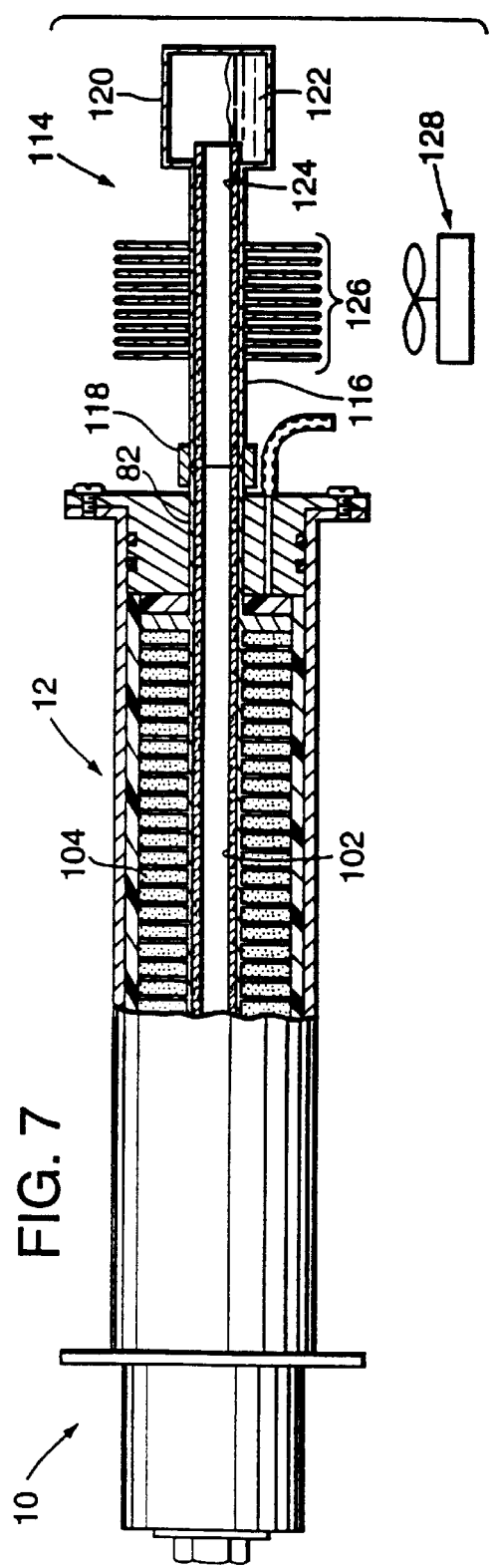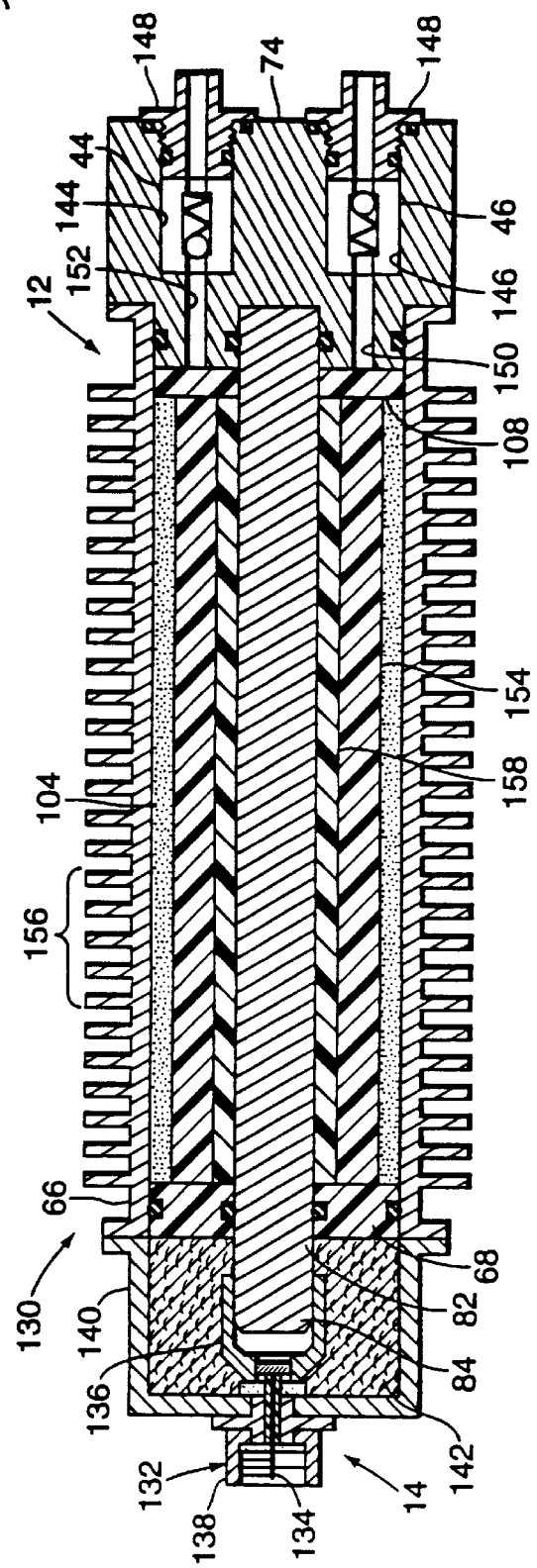

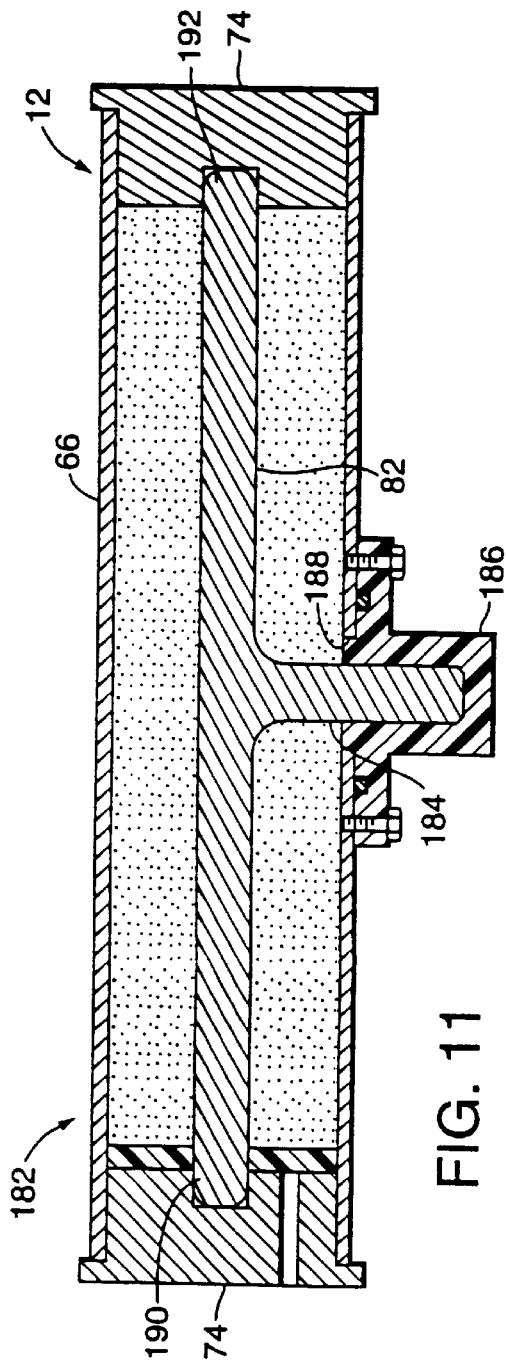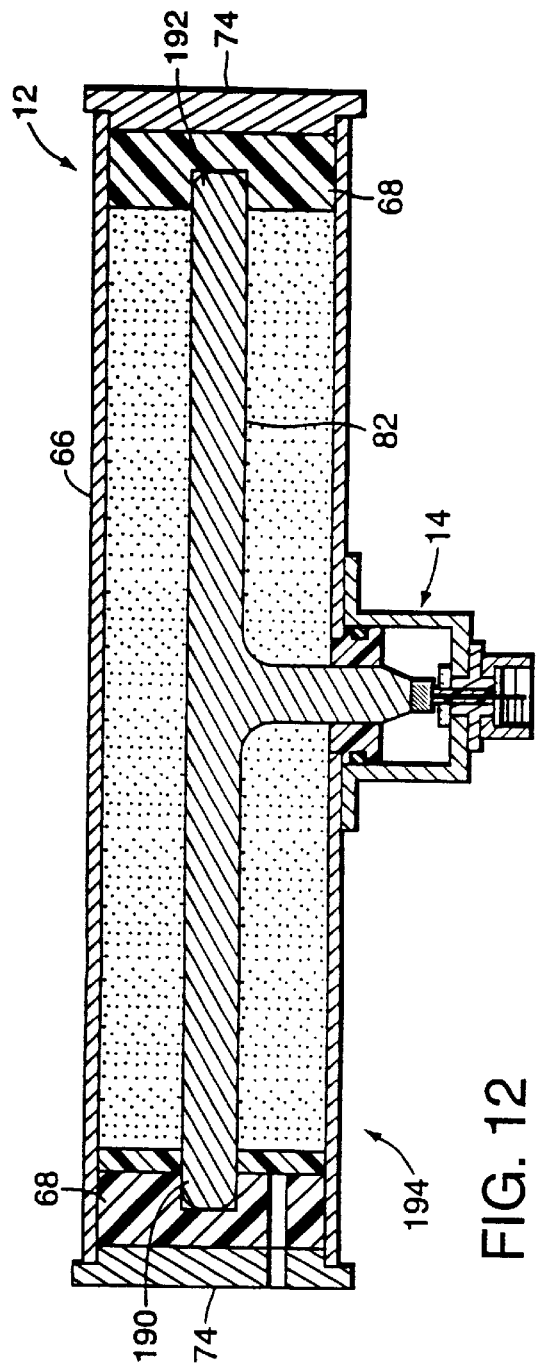

ELECTRONIC DEVICE COOLING APPARATUS

This is a divisional of U.S. patent application Ser No. 08/821,258 filed Mar. 20, 1997 now U.S. Pat. No. 5,855,119, which is a continuation-in-part of U.S. patent application Ser. No 08/811,759 filed on Mar. 6, 1997, which is a continuation of U.S. patent application Ser. No. 08/533,153 filed on Sep. 20, 1995, now abandoned.

BACKGROUND OF THE INVENTION

The present invention relates to sorption systems wherein a sorbate is alternately adsorbed onto and desorbed from a sorbent. More particularly, the invention relates to a refrigeration sorption system for cooling electrical components wherein the sorbate is desorbed from the sorbent using electromagnetic waves.

Certain electrical components, such as the microprocessors in conventional computers, generate a substantial amount of heat during operation. It has been determined that the performance of a microprocessor can be enhanced significantly by effectively removing this heat. In addition, in accordance with conventional superconducting practice, it is known that the operating speed of a microprocessor can be greatly increased if the microprocessor is operated at low temperatures.

In adsorption and absorption systems, which will be referred to herein as sorption systems, a first substance called a sorbate is alternately adsorbed (or absorbed) onto and then desorbed from a second substance called a sorbent. Specific sorbates and sorbents will usually be selected for a particular sorption system to produce a desired effect which is dependent on the affinity of the two substances. During an adsorption reaction, which is also referred to as the adsorb cycle or the adsorb portion of the sorption cycle, the sorbate is drawn onto and combines with the sorbate to produce a sorbate/sorbent compound. During the desorption reaction, which is also called the desorb cycle or the desorb portion of the sorption cycle, energy is supplied to the sorbate/sorbent compound to break the bonds between the sorbate and sorbent molecules and thereby desorb, or in other words separate or drive off, the sorbate from the sorbent. Substantial energy is imparted to the sorbate during the desorption reaction, and this energy can be harnessed for various uses.

An exemplary refrigeration sorption system may use a polar refrigerant, such as ammonia, as the sorbate and a metal halide salt, such as strontium bromide, as the sorbent. During the desorption reaction, which occurs in an enclosure called a sorber, the refrigerant molecules are driven off of the salt and into a relatively high pressure, high energy gaseous state. The refrigerant gas is subsequently condensed and then evaporated to produce a cooling effect. The evaporated refrigerant gas is then channeled back to the sorber, where it is once again adsorbed onto the salt in an adsorption reaction. The sorption cycle is repeated numerous times depending on the cooling requirements of the refrigeration system.

In certain prior art sorption systems, the desorption energy is supplied by a conventional heater. In such a system, a great deal of thermal energy is required to stochastically heat the sorbate/sorbent compound to the degree sufficient to break the bonds between the sorbate and sorbent molecules. As a result, the sorbate, sorbent and sorber are significantly heated, and substantial time and/or energy are required to remove this sensible heat and cool the sorber and sorbent before the next adsorption reaction can proceed.

In the refrigeration system described in the above-mentioned application, the desorption energy is supplied in the form of electromagnetic waves, such as radio frequency waves or microwaves, generated by, for example, a magnetron. Instead of heating the sorbate/sorbent compound, the electromagnetic waves selectively pump electrical energy into each sorbate-sorbent bond until the bond is broken and the sorbate molecule is separated from the sorbent molecule. Therefore, the sorbate, sorbent and sorber are not heated during the desorption reaction and consequently do not need to be cooled before the next adsorption reaction can proceed. As the desorption reaction is essentially isothermal, the overall performance of the refrigeration system is greatly improved.

SUMMARY OF THE INVENTION

According to the present invention, a refrigeration system for cooling an electrical component is provided which comprises a sorber having a housing defining an enclosure, a sorbate/sorbent compound located within the enclosure, the sorber including a port through which a sorbate may be communicated into and out of the enclosure, and means for electrically coupling the sorber to an electromagnetic wave generator, wherein electromagnetic waves transmitted by the electromagnetic wave generator are propagated through the enclosure to desorb the sorbate from the sorbate/sorbent compound. The refrigeration system of the present invention also includes a condenser connected to the port downstream of the sorber, an evaporator connected between the condenser and the port and positioned in close proximity to the electrical component, and a controllable valve interposed between the condenser and the evaporator. In this manner, sorbate which is desorbed in the sorber is condensed in the condenser and then controllably released into the evaporator to create a cooling effect and thereby cool the electrical component, after which the sorbate is drawn back into the sorber.

These and other objects and advantages of the present invention will be made apparent from the following detailed description, with reference to the accompanying drawings.

BRIEF DESCRIPTION OF THE DRAWINGS

FIG. 5 is a partial perspective view of the coaxial waveguide applicator depicted in FIG. 4;

FIG. 6 is a radial cross-sectional view of the coaxial applicator taken along line 6—6 of FIG. 4;

FIG. 7 is a longitudinal cross sectional view of a second embodiment of the coaxial applicator of the present invention;

FIG. 8 is a longitudinal cross sectional view of a third embodiment of the coaxial applicator of the present invention;

FIG. 11 is a longitudinal cross sectional view of a sixth embodiment of the coaxial applicator of the present invention;

FIG. 12 is a longitudinal cross sectional view of a seventh embodiment of the coaxial applicator of the present invention;

DETAILED DESCRIPTION OF THE PREFERRED EMBODIMENTS

The coaxial waveguide applicator described and claimed herein may be used in a variety of sorption systems; however, for simplicity sake the operation of the preferred embodiment of the coaxial waveguide applicator will be described in conjunction with an exemplary refrigeration sorption system. In addition, although the coaxial waveguide applicator of the present invention may be designed to operate within a wide range of electromagnetic frequencies, the preferred embodiment in particular will be described in the context of the radio frequency or microwave bands of the electromagnetic spectrum.

Furthermore, while the coaxial waveguide applicator described herein may be designed for use with any of a variety of sorbate and sorbent substances, the preferred embodiment of the invention contemplates using a polar gas, such as ammonia, methane or alcohol, as the sorbate and a metal halide salt, such as strontium bromide, as the sorbent. It should be understood that the selection of particular sorbates and sorbents depends upon the desired objective of the sorption system. In the refrigeration system described below, for example, a desired temperature drop may be achieved by using ammonia as the sorbate and strontium bromide as the sorbent.

Figure 1:
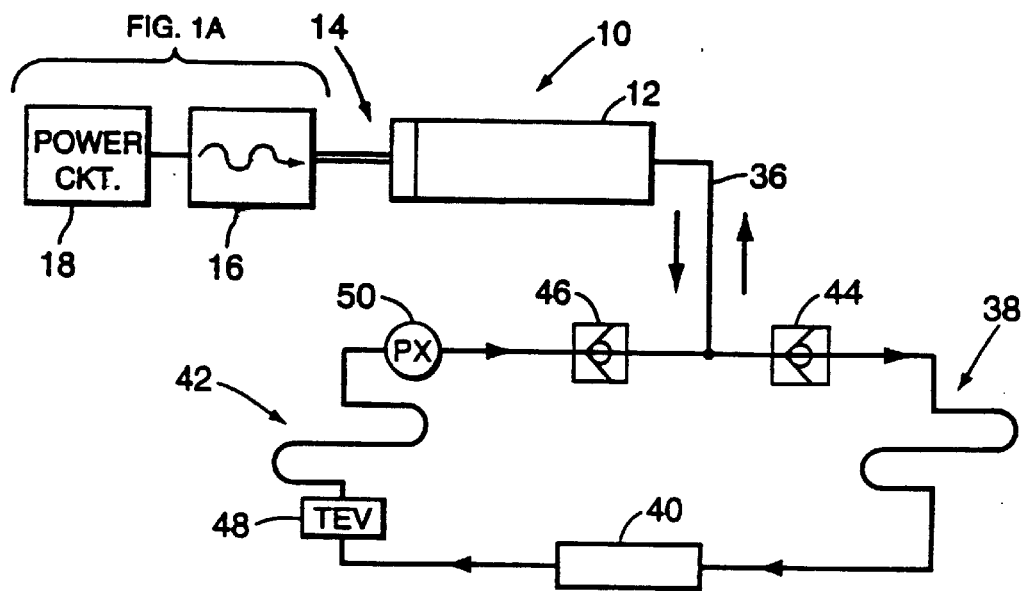
FIG. 1 is a schematic representation of an exemplary refrigeration sorption system incorporating the coaxial waveguide applicator of the present invention.

Referring to FIG. 1, an exemplary refrigeration sorption system according to the present invention is shown to comprise a waveguide applicator 10 having a sorber 12 which houses a sorbent, such as strontium bromide. In the context of the present invention, a sorber is generally defined as a sealed enclosure which contains a sorbent and in which the adsorption (or absorption) and desorption reactions take place. Further details of the waveguide applicator 10 will be presented in connection with the description of FIGS. 4 through 16.

As will be described more fully hereafter, the waveguide applicator 10 includes a waveguide coupler 14 for coupling the sorber 12 to a magnetron 16 or any other suitable means for generating electromagnetic waves in the frequency band of interest. Magnetron 16 is powered by a power circuit 18 which preferably includes, with reference to FIG. 1A, an alternating current power source 20 connected to a solid state switch 22 which feeds a transformer 24 which in turn drives the magnetron 16. The power circuit 18 also includes a programmable microcontroller 26, such as the Motorola MC68HC05 microcontroller, for controlling the operation of the switch 22 and other components of the sorption system, as will be described. The microcontroller 26 includes a clock 28 and an associated memory device (not shown) for storing program operating instructions.

Figure 1A:
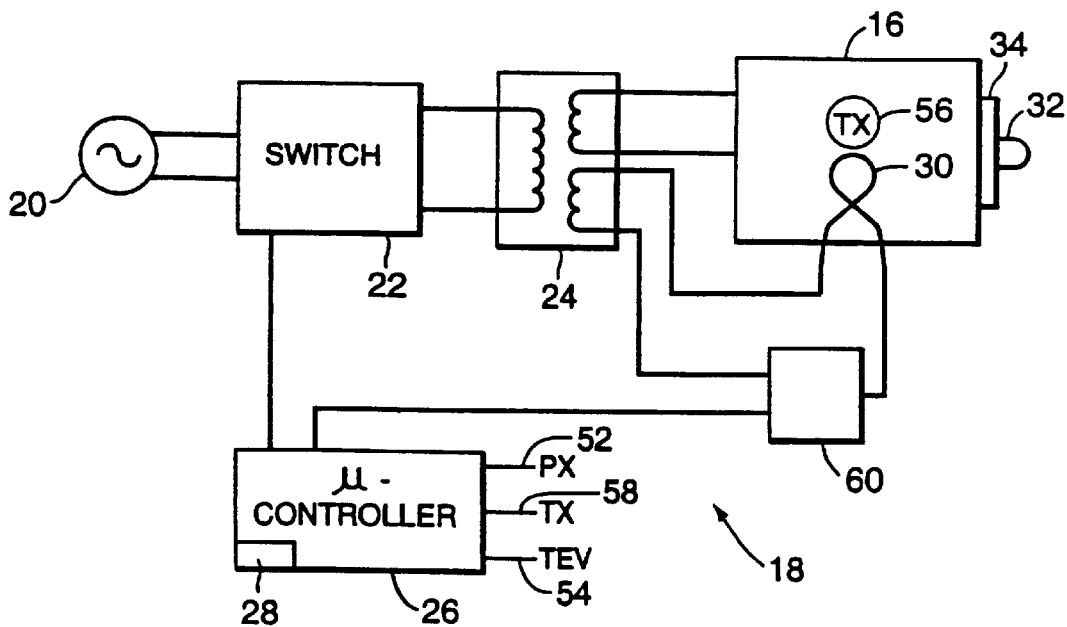
FIG. 1A is a schematic diagram of the power supply and electromagnetic wave generator of the sorption system depicted in FIG. 1.

The selection of the magnetron 16 depends upon the power requirements of the particular system in which the waveguide applicator 10 is used and the desired operating frequency of the system. For the exemplary refrigeration sorption system depicted in FIG. 1, a suitable magnetron 16 is the Samsung 900 Watt cold cathode magnetron, which has an output frequency of 2.54 GHz. The representative magnetron 16 depicted in FIG. 1A is shown to comprise a cathode 30, an antenna 32 and an outer conductor 34. The structural details of the magnetron 16 are well understood by those skilled in the art and form no part of the present invention. Of course, any other electromagnetic wave generator may be used in conjunction with waveguide applicator 10, such as a klystron, a traveling wave tube or any solid state device that is capable of providing a desired level of power at the required frequency.

Referring again to FIG. 1, the exemplary refrigeration sorption system is a closed loop system which comprises an input/output line or conduit 36 communicating with the interior of the sorber 12, a condenser 38 connected to the input/output line 36, a receiver or refrigerant reservoir 40 in communication with the output of the condenser 38, and an evaporator 42 connected between the receiver 40 and the input/output line 36. Suitable check valves 44, 46 are provided between the input/output line 36 and the condenser 38 and evaporator 42, respectively, to control the flow of the sorbate through the system and into and out of the sorber 12. It should be understood that separate lines could be provided to connect the sorber 12 respectively with the condenser 38 and the evaporator 42.

The design of the condenser 38 is dependent upon the volume of the sorbate employed in the system, which in turn depends upon the temperature drop desired at the evaporator 42 and the specific sorbate and sorbent employed in the system, as will be described hereafter by way of example. In the exemplary refrigeration system of FIG. 1, wherein the sorbate is ammonia and the sorbent is strontium bromide, the volume of the condenser 38 is preferably sufficiently large to maintain the liquid sorbate at a pressure between approximately 130 psi and 140 psi, which results in a condenser temperature of around 30° to 50° C. The condenser 38 may be provided with cooling fins or other means to dissipate the heat of condensation from the sorbate during the time required for the desorb cycle. Since the present invention does not result in thermal energy being transferred to the sorbate during the desorption reaction, a smaller condenser may be used than is typically required in sorption systems. In addition, depending on the system, the condenser 38 may be dispensed with and the sorbate vented directly into the receiver 40, or, if the volume of the conduit between the check valve 44 and the evaporator 42 is sufficiently large, both the condenser 38 and the receiver 40 may be omitted.

The evaporator 42 is designed using conventional refrigeration techniques to have the capacity and configuration required to achieve a desired cooling effect. A flow control valve, for example a TEV 48, is preferably provided upstream of the evaporator 42 to selectively discharge the liquid sorbate into the evaporator 42. The TEV 48 is a conventional electrically-controlled, solenoid-actuated valve. The particular TEV selected should have a capacity large enough to accommodate the mass flow rate of the sorbate in the system. In accordance with the exemplary refrigeration sorption system described herein, the operation of the TEV 48 is dependent on the pressure in the evaporator 42, which is measured by a suitable pressure sensor 50 which is preferably located at the output of the evaporator 42. The pressure sensor 50 transmits a signal indicative of the evaporator pressure to the microcontroller 26 over a lead 52, and the microcontroller 26 controls the operation of the TEV via appropriate signals communicated over a lead 54. In order to prevent the sorbate from evaporating inside the TEV 48, a capillary tube is inserted into the outlet of the TEV 48 and extends into the evaporator 42 to a point where the load to be cooled is expected to be concentrated. The diameter of the capillary tube is typically selected to be between about 0.004 to 0.030 inch, depending on the mass flow rate of the sorbate. Any other suitable flow control valve, for example a thermal expansion valve, may be used in place of the TEV 48.

The sorbent is preferably combined, or charged, with the sorbate prior to being placed in the sorber 16. Before this is done, however, the sorbent should be thoroughly dried to remove any moisture. Such moisture may cause arcing in a coaxial applicator 10 which is not designed to use water as the sorbate. The removal of the moisture may be accomplished by subjecting the sorbent to a vacuum and exposing it to microwaves. The vacuum removes the moisture molecules which are desorbed from the sorbent by the microwaves. Then, in a moisture-free enclosure, a predetermined amount of sorbent is combined with a predetermined amount of sorbate, which amounts depend on the requirements of the system, as will be explained hereafter by way of example. The sorbate molecules bond with the sorbent molecules to form a sorbate/sorbent compound, and the compound is preferably packed into the sorber 16 to a pressure of about 50 psi to ensure that the compound makes good contact with the surrounding structural elements.

During the desorb cycle, microwaves from the magnetron 16 are propagated through the sorbate/sorbent compound by waveguide applicator 10 to desorb the sorbate from the sorbate/sorbent compound. The microwaves selectively pump electrical energy into each sorbate-sorbent bond until the bond is broken and the sorbate molecule is separated from the sorbent molecule. It is believed that the microwaves induce dipolar rotation in the sorbate molecules, imparting sufficient kinetic energy to allow them to escape from the electrical potential binding them to their associated sorbent molecules. The sorbate is thus driven off of the sorbate/sorbent compound and into a relatively high pressure, high energy gaseous state. The high pressure sorbate gas expands isothermally past check valve 44 into the condenser 38, where it condenses to a relatively high pressure liquid state. The liquid sorbate is then communicated into the receiver 40, where it is held by the TEV 48 until a cooling cycle is to begin.

After the desorption reaction has been completed, the system is immediately ready to commence an adsorb cycle. Due to the chemistry involved, the speed of the adsorption reaction depends in part on the temperature of the sorbent: the cooler the sorbent, the faster the sorbate molecules can be combined with the sorbent molecules. In the present invention the electromagnetic waves do not transmit thermal energy to the sorbent during the desorption reaction; thus, the sorbent does not need to be cooled prior to commencing the adsorption reaction. Therefore, an adsorption reaction may begin immediately following a desorption reaction in the sorption cycle.

During the adsorb cycle, which corresponds with the cooling cycle in the embodiment of the refrigeration sorption system depicted in FIG. 1, liquid sorbate is released by the TEV 48 into the evaporator 42. The sorbate evaporates to produce a cooling effect and, due to the affinity between the sorbate and the sorbent, the evaporated sorbate is drawn through the check valve 46 and the line 36 into the sorber 12. The sorbate combines with the sorbent in a chemical reaction that produces the sorbate/sorbent compound, as discussed above. This chemical reaction generates a heat of adsorption, which heat must ideally be dissipated before the next adsorb cycle may begin. Accordingly, the waveguide applicator 10 may be provided with cooling means, examples of which are described below, to dissipate the heat of adsorption during the adsorb and desorb cycles. Consequently, the sorption cycle may proceed repeatedly from the desorb cycle to the adsorb cycle without requiring a sorbent cooling cycle in between.

Figure 2:
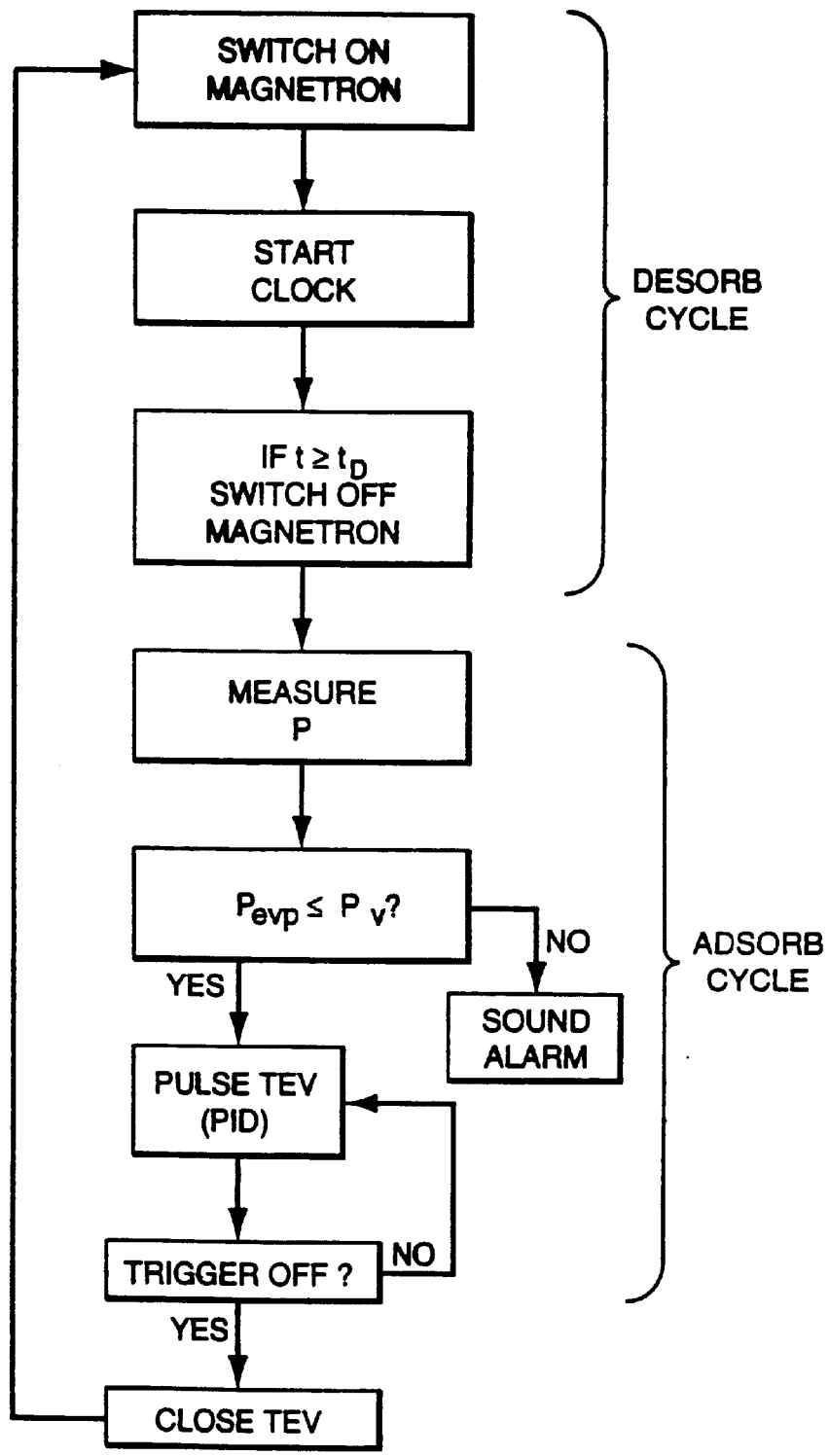
FIG. 2 is a flow diagram of the process control steps of the sorption system depicted in FIG. 1.

In the preferred embodiment of the invention, the microcontroller 26 controls the operation of the sorption system and, consequently, the execution of the desorb and adsorb cycles, in response to preprogrammed process control software stored in the associated memory device. Referring to FIG. 2, the desorb cycle begins when the microcontroller 26 sends a signal to switch 22 to activate magnetron 16. Simultaneously, the microcontroller begins to track time, or count pulses, from its clock 28. Once the time reaches the predetermined desorb cycle time, the derivation of which will be described hereafter by way of example, the magnetron sends a signal to switch 22 to deactivate the magnetron 16.

Alternatively, the end of the desorb cycle can be determined by sensing the temperature of the magnetron 16. In this embodiment, which is illustrated in FIG. 1A, the sorption system of the present invention includes a suitable temperature sensor 56 which is positioned adjacent the cathode 30 and communicates with the microcontroller 26 via a lead 58. As the sorbate is desorbed from the sorbate/sorbent compound, the characteristic impedance of the waveguide applicator will change. Consequently, a percentage of the power will not be transmitted to the waveguide applicator 10, and this will cause the cathode 30 to heat up. Once the temperature of the cathode 30 increases by a predetermined amount, for example 15° C., the microcontroller 26 deactivates the magnetron 16 to end the desorb cycle. The specific temperature rise will depend on the given system and magnetron employed and may be determined empirically.

After the desorb cycle has been completed, the microcontroller senses the evaporator pressure ($P_{evp}$) and compares this to the vapor pressure of the sorbate at the desired evaporator temperature ($P_v$). If $P_{evp}$ is less than or equal to $P_v$, then the microcontroller 26 pulses the TEV 48 to release the sorbate into the evaporator 42 and thereby begin the adsorb cycle. The pulse width and initial cycle of the TEV 42 are determined empirically for a given system, the objective being to ensure that all of the sorbate evaporates and a superheat of around 3° to 5° C. is maintained so that the sorbate remains in the gas state when it leaves the evaporator 42. The microcontroller 26 then optimally executes a proportional integral derivative (PID) control routine to modulate the frequency of the pulse cycle. If, however, $P_{evp}$ is greater than $P_v$, which may indicate for example that the TEV 48 is stuck open and the evaporator is flooded, an alarm will preferably sound so that the malfunction can be addressed.

During the PID routine, the microcontroller samples $P_{evp}$ at a rate at least twice the pulse frequency and modulates the pulse frequency depending on the measured changes in $P_{evp}$ to maintain $P_{evp}$ less than or equal to $P_v$. Alternatively, the microcontroller may modulate the pulse width to achieve the same effect. The PID routine requires several input variables, including the phase margin, the phase margin frequency, the percent overshoot and the peak time. These input variables are determined by measuring the response of the system, for example the pressure at the pressure sensor 50, to known inputs. The implementation of the PID control routine in software and the derivation of the input variables is achieved using known techniques. As an alternative to the PID control routine, the microcontroller 26 may pulse the TEV 48 in accordance with any suitable fuzzy logic or heuristic control routine to achieve the results described above.

The process control software preferably includes a software trigger to determine the end of the adsorb cycle. In one embodiment, the microcontroller may simply compare the elapsed time from the clock 28 with the total cycle time. If the elapsed time is equal to the predetermined desorb cycle time plus the predetermined adsorb cycle time, the derivation of which will be described hereafter by way of example, the microcontroller will close the TEV 42 and begin another desorb cycle. Alternatively, if the microcontroller 26 determines that $P_{evp}$ is not equal to $P_v$ within two settling times of the system, which condition indicates that the evaporator may have become flooded, then the microcontroller 26 will close the TEV 42 and begin another desorb cycle. Otherwise, the microcontroller 26 will continue pulsing the TEV 42 as part of the adsorb cycle. Of course, the above software triggers may both be used to provide redundancy, if desired.

After the adsorb cycle and prior to the desorb cycle, the pressure within the sorber 12 is relatively low. Consequently, a possibility exists that a plasma ignition may occur in the sorber 12 as a result of the Geissler effect once the magnetron 16 is activated to begin the desorb cycle. A plasma ignition may destroy the sorbent and reduce the performance of the sorption system. In order to prevent the occurrence of a plasma ignition, the present invention contemplates increasing the pressure in the sorber 12 prior to or at the onset of the desorption reaction. Accordingly, the microcontroller 26 may be programmed to pulse the TEV 48 briefly, for example three times, prior to actuating the magnetron 16 in order to bring the pressure within the sorber 12 to a level sufficient to avoid the Geissler effect. Alternatively, with reference to FIG. 1A, the power circuit 18 of the sorption system may include a power mosfet 60 to control the current of the cathode 30. Mosfet 60 is controlled by the microcontroller 26 to gradually increase the current in the magnetron 16 to initiate desorption and thereby gradually increase the pressure in the sorber 16 before the full power of the magnetron 16 is transmitted to the sorber 12.

The requirements of the exemplary refrigeration sorption system determine the types and amounts of the sorbate and sorbent to be used. If the cooling requirements, in terms of cooling capacity or rate, are greater than the capacity of the magnetron, then a single waveguide applicator 10 may be used in a batch cooling system.

EXAMPLE 1

For example, assume that a 900 W magnetron is available and that the system is required to provide 3 kW of cooling to maintain an evaporator temperature of −50° C. for 30 seconds. The required evaporator temperature suggests the use of ammonia as the sorbate or refrigerant. Since as mentioned above it is desired to maintain the condenser temperature between 30° and 50° C., a sorbent must be selected that will allow the ammonia to evaporate from a liquid at 30° to 50° C. to a vapor at −50° C. Accordingly, from the vapor pressure curves for various ammonia-sorbent compounds, one is led to select strontium bromide as the sorbent. The high affinity or bond strength between ammonia and strontium bromide produces a sufficiently low vapor pressure upon adsorption to allow the ammonia to evaporate at −50° C. from a liquid at 50° C.

Once the sorbate and sorbent are selected, the mass flow rate and the amount of sorbate required to achieve the desired cooling effect may be determined. From the saturation properties table for ammonia, the change in enthalpy from the liquid ammonia at 50° C. to vapor ammonia at −50° C. is known to be about 1050 joules per gram. The mass flow rate (MFR) of the ammonia is then determined as follows:

$$MFR = \text{cooling capacity/change in enthalpy}$$
$$= (3000 \text{ J/s})/(1050 \text{ J/g}) = 2.86 \text{ g/s NH}_3.$$

Thus, 2.86 grams of ammonia will evaporate each second at an evaporator temperature of −50° C. Since it is required to maintain this temperature for 30 seconds, a total of 2.86 g/s×30 s=85.80 grams of ammonia are required in the system.

Once the amount of sorbate has been determined, the required amount of sorbent may be calculated. Since the molecular weight of ammonia is about 17.03 g/mole, 85.80 grams of ammonia is equivalent to roughly 5.04 moles. It is known that each molecule of strontium bromide can combine with eight molecules of ammonia. Therefore, assuming complete adsorption of the ammonia onto the strontium bromide, (5.04 moles $NH_3$)/(8 moles $NH_3$ mole $SrBr_2$)=0.63 mole $SrBr_2$ is required. Since the molecular weight of strontium bromide is about 247.43 g/mole, the amount of strontium bromide required is thus 155.88 grams. Of course other factors, for example the time required to dissipate the heat of adsorption, may require that more sorbent be used. These factors depend upon the design of the particular sorber and waveguide applicator.

It is known that approximately 2550 joules of energy are required to desorb one gram of ammonia from strontium bromide. Therefore, to desorb 85.80 grams of ammonia requires 218,790 joules of energy. The time required to do this with a 900 W magnetron is thus 218,790 J /(900 J/s)=243.10 s, which is roughly 4 minutes. Thus, in the example of the batch refrigeration sorption system just described, the desorb cycle will last 4 minutes and be followed by an adsorb cycle of 30 seconds. This cycle may be repeated as required.

Figure 3:
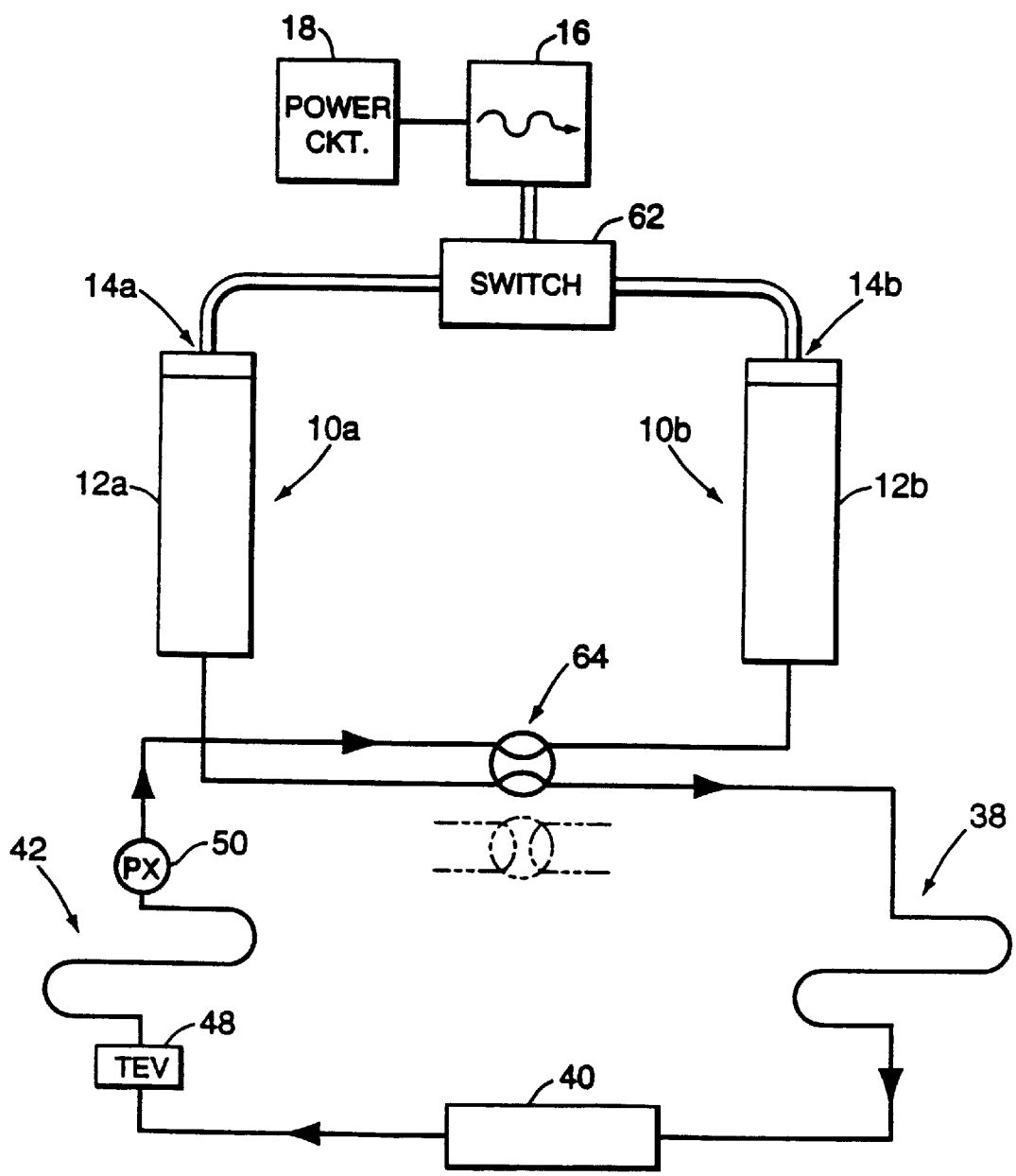
FIG. 3 is a schematic representation of an exemplary refrigeration sorption system incorporating two coaxial waveguide applicators of the present invention.

Referring to FIG. 3, an example of a refrigeration system incorporating two waveguide applicators of the present invention is illustrated. In this embodiment, the same reference numbers will be used to describe elements similar to those depicted in FIG. 1. The exemplary refrigeration sorption system of this embodiment comprises first and second waveguide applicators 10a, 10b, each having a sorber 12a, 12b containing a sorbent. Microwaves from a magnetron 16 are transmitted alternately to the sorbers 12a, 12b through a suitable switch 62 and waveguide couplers 14a, 14b, the latter of which will be described in more detail hereafter. Switch 62 can be of any known type and is preferably actuated automatically by the microcontroller 26. Alternatively, two magnetrons 16 may be provided, in which event the microcontroller would activate the magnetrons successively.

The condensing and evaporating apparatus are similar to those described with reference to FIG. 1. In this embodiment, however, a two-way valve 64 is provided to alternately connect each sorber 12a, 12b respectively with the condenser 38 and the evaporator 42. Valve 64 is preferably an electrically-actuated valve which is controlled by microcontroller 26. However, valve 64 may be any suitable means to perform the required function, and other valving arrangements, such as combinations of check valves, may be provided for this purpose.

In one position of valve 64, which is depicted in FIG. 3, the sorber 12a is connected with the condenser 38 and the sorber 12b is in communication with the evaporator 42. In this position, the microcontroller 26 actuates the switch 62 to direct the microwaves to the waveguide applicator 10a and commence a desorption reaction in sorber 12a. The sorbate gas from sorber 12a is condensed in the condenser 38. At the same time, liquid sorbate in the receiver 40 is released by the TEV 48 into the evaporator 42 and drawn into the sorber 12b in an adsorption reaction. Thus, sorber 12a may undergo a desorption reaction while sorber 12b is undergoing an adsorption reaction.

After the longer of the desorb cycle in sorber 12a or the adsorb cycle in sorber 12b is completed, the microcontroller 26 switches valve 64 to the position shown in phantom in FIG. 3 to connect the sorber 12b with the condenser 38 and the sorber 12a with the evaporator 42. The microcontroller then actuates the switch 62 to direct the microwaves to the waveguide applicator 10b and commence a desorption reaction in sorber 12b. The sorbate gas from sorber 12b is condensed in the condenser 38, while simultaneously liquid sorbate in the receiver 40 is released by the TEV 48 into the evaporator 42 and drawn into the sorber 12a in an adsorption reaction. Thus, sorber 12b may undergo a desorption reaction at the same time sorber 12ba is undergoing an adsorption reaction.

If the refrigeration sorption system depicted in FIG. 3 is designed so that the adsorb cycle time is greater than or equal to the desorb cycle time, then sorbate may continually be evaporated in the evaporator 42 to provide continuous cooling. The process control software for the system of FIG. 3 may be implemented in a manner similar to that discussed above for the system of FIG. 1. The continuous cooling system of FIG. 3 is ideally suited for use when the cooling requirements are less than or equal to the capacity of the magnetron.

EXAMPLE 2

For example, assume that the system is required to provide 100 W of cooling to maintain a constant evaporator temperature of −50° C. With ammonia as the sorbate and strontium bromide as the sorbent, the mass flow rate of the ammonia for this system is calculated as follows:

$$MFR = \text{cooling capacity/change in enthalpy}$$
$$= (100 \text{ J}/\text{s})/(1050 \text{ J}/\text{g}) = 0.095 \text{ g}/\text{s NH}_3.$$

In a multiple sorber system, a minimum amount of sorbent is desired for each sorber. In the two sorber system of FIG. 3, an appropriate amount of strontium bromide for each sorber is 20 grams, which is equivalent to 0.081 mole $SrBr_2$. This amount of strontium bromide can adsorb (0.081 mole $SrBr_2$)×(8 moles $NH_3$/mole $SrBr_2$)×(17.03 g $NH_3$/mole)=11.035 g $NH_3$. The minimum time required to adsorb this amount of ammonia is (11.035 g $NH_3$)/(0.095 g/s $NH_3$)=116.16 seconds.

The adsorb cycle time determines the power of the magnetron that the system will require. In order to have continuous cooling, the desorption reaction in the second sorber must be completed in 116.16 seconds. From the previous example, 2550 joules of energy are required to desorb one gram of ammonia from strontium bromide. Accordingly, 11.035 g $NH_3$×2550 J=28,139.25 joules of energy are required to completely desorb the ammonia from the strontium bromide in the system. Since this energy must be expended in 116.16 seconds, approximately 242.24 Watts of power are required for the desorption reaction. Thus, a standard 250 W or 300 W magnetron may be used in this example.

The nature of the electromagnetic wave-activated desorption reaction of the present invention allows for partial desorption of the sorbate from the sorbate/sorbent compound, or in other words, desorption of less than the entire amount of sorbate from the sorbate/sorbent compound. Thus, single or dual sorber systems may be designed to perform a multitude of functions. For example, a dual sorber system may be designed to provide both continuous cooling and rapid freezing on demand.

EXAMPLE 3

In this example, assume that a refrigerator/freezer appliance is required to provide 100 W of continuous cooling to maintain a constant evaporator temperature of −50° C. In addition, assume that the appliance incorporates an ice maker which is required to generate 3 kW of batch cooling in order to freeze a predetermined volume of water in 30 seconds, which because of the evaporator design would require that the evaporator temperature be maintained at −50° C. for this length of time. Finally, assume that the system comprises a single 900 W magnetron to generate these cooling requirements.

From the first example above, we know that in order to obtain the 3 kW of batch cooling, the system requires at least 155.88 grams of strontium bromide and 85.80 grams of ammonia having at a mass flow rate of 2.86 g/s. Thus, the first sorber must be designed to contain this amount of strontium bromide and the rest of the system must be designed to accommodate this mass flow rate.

In addition, we can assume from the second example above that the second sorber comprises 20 grams of strontium bromide, and we therefore know that each sorber is alternately required to desorb 11.035 grams of ammonia in order to achieve 100 W of continuous cooling and that the energy required to do this is 28,139.25 joules. Since the system of the present example employs a 900 W magnetron, the desorb cycle time is determined to be 28,139.25 J/(900 J/s)=31.26 seconds. However, we also determined from the previous example that to provide the required 100 Watts of continuous cooling, a mass flow rate of 0.095 g/s is required and the minimum adsorb cycle time is therefore 116.16 seconds.

Thus, assuming the mass flow and heat diffusion characteristics of both sorbers are approximately the same, each sorber may be alternately desorbed for 31.26 seconds to provide 100 Watts of continuous cooling at an evaporator temperature of −50° C. While a desorb cycle is underway in one sorber, the microcontroller controls the TEV to discharge liquid sorbate into the evaporator at a rate of 0.095 g/s to maintain an adsorb cycle time of 116.16 seconds in the other sorber. Therefore, the total sorption cycle is roughly 147.42 seconds for the 100 W continuous cooling demand.

Although the desorb cycle time for continuous cooling in this example is only 31.26 seconds, we know from example 1 that roughly four minutes are required to completely desorb the first sorber to meet the batch cooling requirement. Thus, while operating in the continuous cooling mode, the first sorber will undergo only a partial desorption reaction for 31.26 seconds, after which it will fully recharge, or adsorb, during the 116.16 second adsorb cycle.

In order to provide the batch cooling on demand, the first sorber must be completely desorbed for four minutes. This can be accomplished by interrupting the continuous cooling cycle, or operating the batch cooling cycle in off peak hours when continuous cooling is not required. In order to meet the specific cooling requirements, the microcontroller is programmed to actuate the TEV to release the liquid sorbate into the evaporator at the predetermined mass flow rates to maintain the predetermined adsorb cycle times.

Alternatively, a system of three sorbers may be employed to meet the cooling requirements of example 3. The first two sorbers can be substantially as described with respect to example 2 to provide the required 100 W of continuous cooling. The third sorber can be substantially as described in example 1 to provide the required 3 kW of batch cooling. During each continuous cooling cycle, the magnetron is not utilized for a time equal to the difference between the adsorb cycle time and the desorb cycle time, or in this example about 85 seconds. During this time, the magnetron may be activated and the microwaves directed to the third sorber to partially desorb the third sorber. Since four minutes are required to desorb the third sorber, it may be completely desorbed in roughly three continuous cooling cycles. This allows the appliance to provide continuous cooling without interruption.

Figure 4:
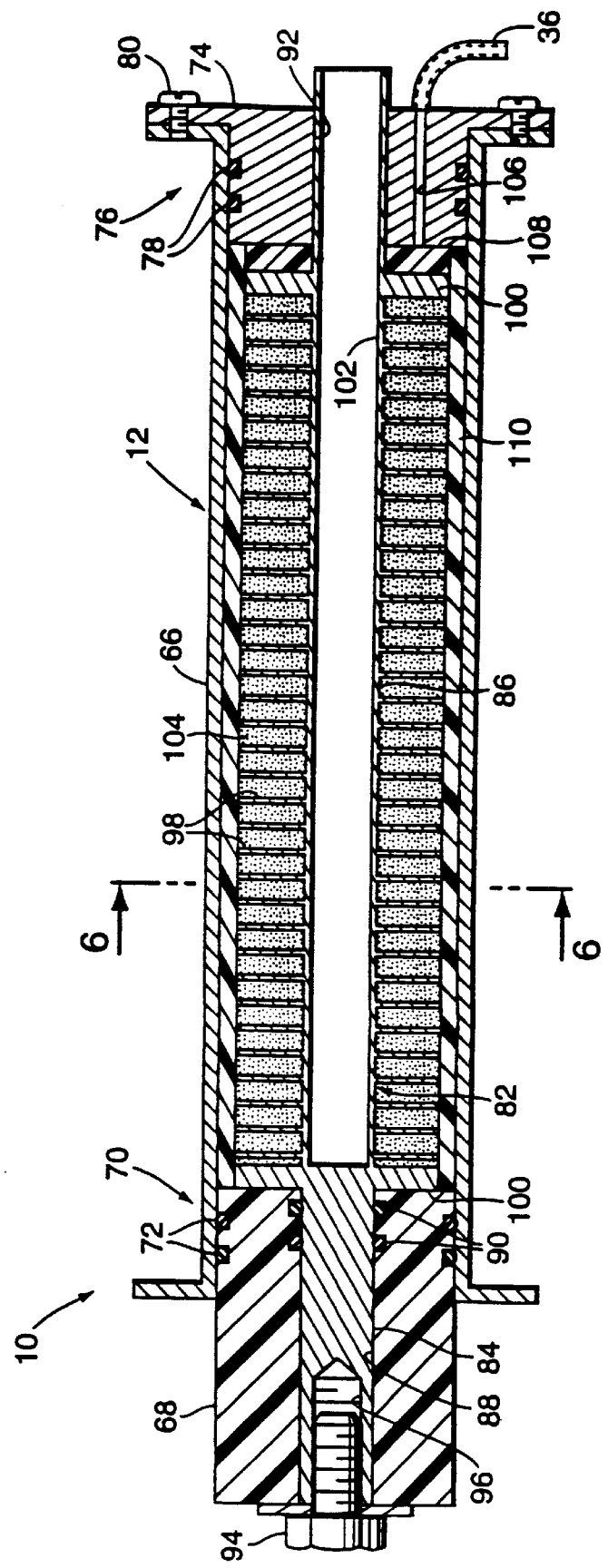
FIG. 4 is a longitudinal cross-sectional view of a portion of one embodiment of the coaxial waveguide applicator of the present invention.

Referring now to FIGS. 4–6, an embodiment of the coaxial waveguide applicator 10 of the present invention is shown to comprise a sorber 12 having a generally tubular metallic housing 66 which defines an outer conductor of the waveguide applicator 10. An end plug 68 is positioned in a first end 70 of sorber 12 and sealed therein by means of preferably elastomeric O-ring seals 72, and an end cap 74 is positioned over a second end 76 of sorber 12 and similarly sealed thereagainst by means of O-ring seals 78. End plug 68 and end cap 74 are secured within ends 70, 76 by any suitable means, such as bolts 80 in the case of end cap 74, to thereby define a sealed enclosure within the outer conductor 66.

In this embodiment of the invention, a metallic inner conductor 82 is provided which includes a first end 84 beginning beyond the left end (as viewed in FIG. 4) of the outer conductor 66 and a second end 86 extending into the outer conductor 66 parallel to the longitudinal axis of the sorber 12. The first end 84 is received in a bore 88 formed in the end plug 68 and is sealed therein by O-ring seals 90. The second end 86 is received in a bore 92 formed in the end cap 74 and is sealed and secured therein by any suitable means, such as swaging or welding. In this embodiment, end plug 68 is secured in end 70 of sorber 12 by means of a bolt 94 which is threaded into a corresponding hole 96 formed in the first end 84 of inner conductor 82. The inner conductor 82 also preferably comprises a plurality of radial metal fins 98 secured thereto or formed integrally therewith. The inner conductor 82 may also include radial flanges 100 flanking the fins 98 and an inner axial bore 102 extending substantially through the second end 86 thereof, the purpose of which will be made apparent below.

An appropriate sorbent 104, which in the Figures is represented as a salt, is prepared with a sorbate as discussed above and packed into the spaces between the fins 98. In addition, a port 106 is formed in the end cap 74 to allow the sorbate in line 36 to enter and exit the sealed enclosure of the sorber 12 during the adsorption and desorption reactions. A suitable filter 108, such as a perforated Polyethylene or Teflon disk, is preferably positioned at the interface of the port 106 and the sealed enclosure to prevent the sorbent from migrating out of the sealed enclosure and into the line 36. In addition, a manifold sleeve 110 is positioned between the outer conductor 66 and the sorbent 104 to facilitate the communication of the sorbate into and out of the sorbent 104. The manifold sleeve 110 of this embodiment is preferably formed of perforated Polyethylene and includes a plurality of longitudinal grooves 112 formed in the outer surface thereof (see FIGS. 5 and 6). Thus, sorbate gas is allowed to flow down the grooves 112 and through the manifold sleeve 110, and vice-versa. The perforated material of the manifold sleeve 110 also functions as a filter to contain the sorbent in the sorber 12.

The dimensions of the sorber 12 are preferably chosen to minimize the mass flow and thermal diffusion path lengths. These factors determine how quickly the sorbate can be adsorbed and the time required to dissipate the heat of adsorption, respectively. While the mass flow and thermal diffusion rates may be minimized through the selection of sorbates and sorbents, the mass flow and thermal diffusion path lengths are typically minimized by reducing the thickness of the sorbate. However, for a given sorption system that is designed to meet specific requirements, a certain minimum amount of sorbent is required, and reducing the thickness of the sorbent would require increasing the length or diameter of the sorber 12 to maintain this minimum amount of sorbent. Therefore, in the embodiment of the waveguide applicator depicted in FIGS. 4–6, the thickness of the sorbate is maintained at a minimum through the use of the fins 98. Since the fins are constructed of a metallic material and can therefore dissipate heat, the fins also contribute to reducing the thermal diffusion path length. In the absence of fins 98, it has been determined that a suitable thickness for the sorbent in an ammonia-strontium bromide sorption system is between about 1/16 and 1/8 inch.

The diameters of the inner and outer conductors 82, 66 are chosen to provide the sorber 12 with a characteristic impedance that matches the characteristic impedance of the source of the electromagnetic waves as closely as possible. The impedance of the source is either the characteristic impedance of the electromagnetic wave generator or the characteristic impedance of the waveguide coupler 14 which couples the sorber 12 to the electromagnetic wave generator. However, in the present invention the waveguide coupler 14 is preferably designed to have an impedance close to that of the electromagnetic wave generator.

The impedance of the sorber 12 is the combined impedance of the inner and outer conductors 82, 66 and the sorbate/sorbent compound. The equation for the characteristic impedance of concentric cylinders is as follows:

$$Z_0 = (2/c) \times ((\mu/\epsilon)^{1/2}) \times (ln(ID/OD)),$$

where c is the speed of light, $\mu$ is the magnetic permeability of the material between the cylinders, $\epsilon$ is the dielectric constant of the material between the cylinders, ID is the inner diameter of the outer cylinder and OD is the outer diameter of the inner cylinder.

In an ammonia-strontium bromide sorption system, the value for $\mu$ can be assumed to be that for air, that is $1.26 \times 10^{-6}$. Also, the value for $\epsilon$ for liquid ammonia is about 20 and the dielectric constant of strontium bromide can be assumed to be negligible. Since we know that ammonia accounts for roughly 30 to 35% by volume of the ammonia-strontium bromide compound, we can estimate the value of $\epsilon$ for the compound to be about 6.5. Alternatively, the dielectric constant for the sorbate/sorbent compound may be measured directly. Once these values are obtained, they may be plugged into the above equation to determine the desired ratio of the diameters of the inner and outer conductors 82, 66. Usually, however, the maximum outer diameter is limited by the desired size of the coaxial applicator 10.

As an alternative to the above derivation of the characteristic impedance of the sorber 12, this value may be determined by modeling the sorber 12 using conventional numerical modeling techniques. These modeling techniques may also be used to optimize the diameters of the inner and outer conductors 82, 66 and design the waveguide coupler 14 so that an optimum impedance match between the electromagnetic wave generator 16 and the sorber 12 may be obtained.

The inner and outer conductors 82, 66 are formed of metallic materials which optimally transmit the electromagnetic waves through the sorbate/sorbent compound. In addition, the materials for these components are preferably selected to take advantage of the skin effect, which recognizes that at high frequencies the current is transmitted at the surface of the conductor. Thus, in the present embodiment, the electromagnetic waves will be transmitted over the surfaces of the inner conductor 82 and the fins 98. This results in a highly uniform and effective propagation of the electromagnetic waves through substantially the entire volume of sorbent 104. In the preferred embodiment of the invention, the inner conductor 82 is formed of aluminum and the outer conductor 66 is constructed of stainless steel. In addition, the fins 98 are approximately 0.02 inch thick and are spaced about six fins per inch along the inner conductor 82.

As will be described below, the first end 84 of the inner conductor 82 is coupled to, for example, the antenna 32 of the magnetron 16 by a suitable waveguide coupler 14. The end plug 68 is thus manufactured out of an electromagnetic wave-transparent material, such as Teflon, so as not to interfere with the transmission of the waves. In addition, in the embodiment of the waveguide applicator depicted in FIGS. 4–6, the second end 86 of the inner conductor 82 is short circuited to the outer conductor 66 via the end cap 74, which is constructed of a metallic material such as stainless steel. This prevents the waves from being transmitted out of the second end 76 of the sorber 12.

The design of the individual components of the sorber 12 and the waveguide coupler 14 should be undertaken in accordance with conventional radio frequency engineering techniques so as to avoid creating undesirable field concentration points in these components. Thus, edges which are exposed to the electromagnetic field should be smooth or rounded and gradual transitions should be employed between individual components.

Various means may be incorporated with the waveguide applicator 10 to help dissipate the heat of adsorption. With reference to FIG. 7, for example, a heat tube cooler 114 is shown having a hollow metallic heat tube 116 which is attached to the inner conductor 82 by a suitable connector 118. The distal end of the heat tube 116 is in communication with a reservoir 120 containing a volume of refrigerant 122. The heat tube cooler 114 also includes a wick 124, for example a 325 mesh stainless steel screen tube, which extends from the reservoir 120 through the heat tube 116 and substantially entirely into the bore 102 of the inner conductor 82. In addition, a plurality of cooling fins 126 are preferably attached to the heat tube 116. In operation, the wick 124 draws liquid refrigerant from the reservoir 122 into the bore 102. The heat of adsorption produced in the sorbent 104 is conducted by the fins 98 and the inner conductor 82 to the liquid refrigerant in the wick 124. Upon being heated, the liquid refrigerant evaporates and expands into the heat tube 116. The heat of the evaporated refrigerant is then dissipated through the fins 126. Once the refrigerant is cooled sufficiently, it will condense and return to reservoir 120. This cycle is repeated automatically. A fan 128 may also be provided to increase the rate at which the heat is dissipated by the fins 126, which will result in a corresponding decrease in the time required to dissipate the heat of adsorption.

Another embodiment of the waveguide applicator of the present invention is depicted in FIG. 8. In this embodiment, the waveguide applicator 130 is shown to comprise a sorber 12 having an outer conductor housing 66 and a solid inner conductor 82. The first end 84 of the inner conductor 82 extends through the end plug 68 and is connected to a waveguide coupler 14. The waveguide coupler includes a conventional coaxial cable connector 132, such as is described in U.S. Pat. No. 5,216,327. Cable connector 132 comprises an inner conductor 134, which is connected to the inner conductor 82 through a metallic socket 136, and an outer conductor 138, which is connected to the outer conductor 66 via a conducting cap 140. The conducting cap 140 is attached to the outer conductor using any suitable means, such as by bolting, welding or a threaded coupling sleeve (not shown). An appropriate dielectric material 142 is preferably included in the conducting cap 140 to, among other functions, provide support for the end plug 68. In this embodiment of waveguide coupler 14, a standard coaxial cable is used to connect the sorber 12 to an electromagnetic wave generator which is provided with a similar coupler 14.

In the embodiment of FIG. 8, the check valves 44, 46 are incorporated into the end cap 74. The check valves 44, 46 are positioned in corresponding bores 144, 146 formed in the end cap 74 and are preferably secured therein by threaded nipples 148. In this embodiment, the end cap 74 includes an inlet port 150 and an outlet port 152, which are connected respectively to the evaporator and the condenser. The sorbate gas is communicated through the filter 108 and a gas path sleeve 154 to the sorbent 104. The gas path sleeve 154 may be, for example, a porous Polyethylene cylinder. The sorbent is positioned adjacent the outer conductor 66, and radial cooling fins 156 may be provided to help dissipate the heat of adsorption. In addition, a spacer cylinder 158 may be provided to align the gas path sleeve 154 with the inlet and outlet bores 150, 152 or to ensure that the sorbent layer is positioned adjacent the outer conductor 66.

Figure 9:
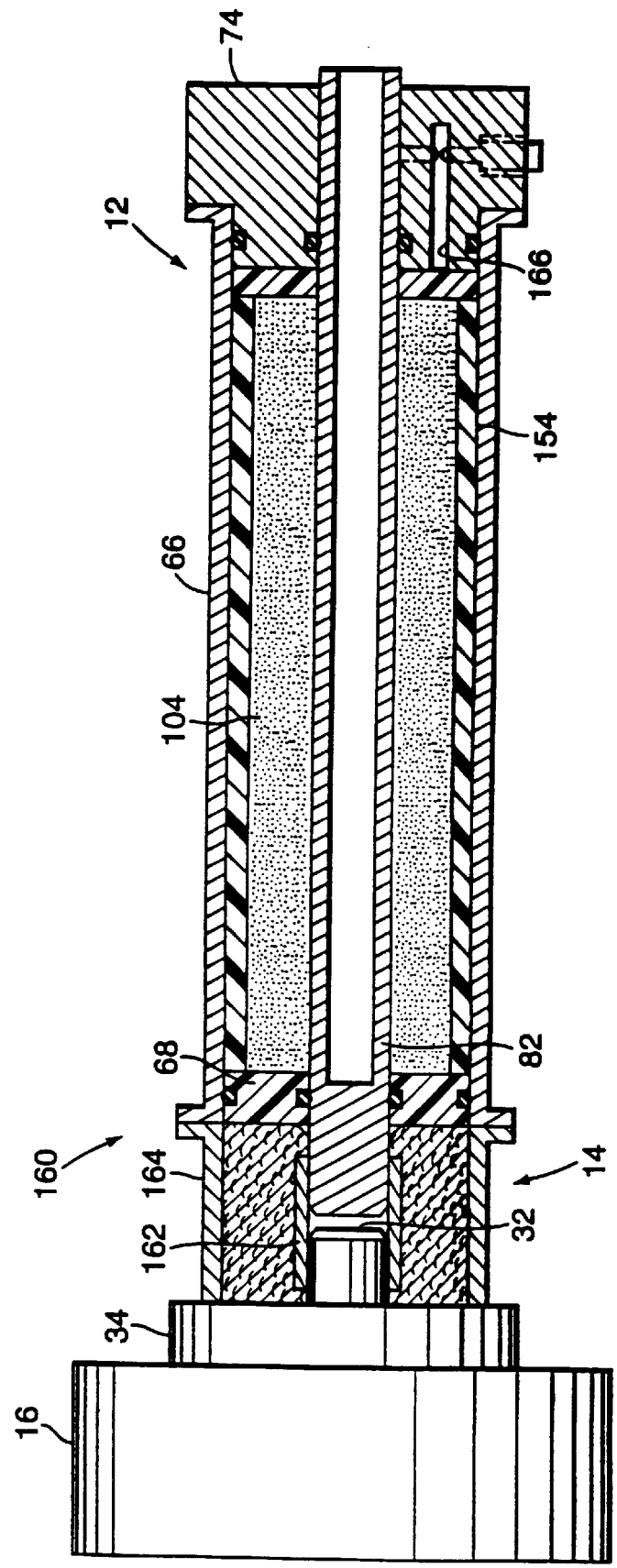
FIG. 9 is a longitudinal cross sectional view of a fourth embodiment of the coaxial applicator of the present invention.

Referring now to FIG. 9, yet another embodiment of the waveguide applicator of the present invention, which is indicated generally by reference number 160, is shown to comprise a sorber 12 having a metallic outer conductor housing 66 and a substantially hollow inner conductor 82. The inner conductor 82 extends through end plug 68 and is coupled via a waveguide coupler 14 directly to, for example, a magnetron 16. The waveguide coupler 14 includes a plug coupler 162 for connecting the inner conductor 82 to the antenna 32 of the magnetron 16 and a conducting sleeve 164 for connecting the outer conductor 34 of the magnetron 16 to the outer conductor 66 of the sorber 12. Of course, the magnetron 16 and the sorber 12 could be made as an integral unit, in which event the antenna 32 of the magnetron would function as the inner conductor 82 and the outer conductor 34 of the magnetron would function as the outer conductor 66 of the sorber 12.

In this embodiment, the end cap 74 includes a single inlet/outlet port 166 and the check valves (only one of which is visible in FIG. 9) are mounted radially in end cap 74 in communication with port 166. The sorbate enters the sorber 12 through port 166 and is communicated to the sorbent 104 through a gas path sleeve 154. The sorbent is positioned adjacent the inner conductor 82, and suitable means, such as the heat tube cooler 114, may be connected to the inner conductor 82 to help dissipate the heat of adsorption.

Figure 10:
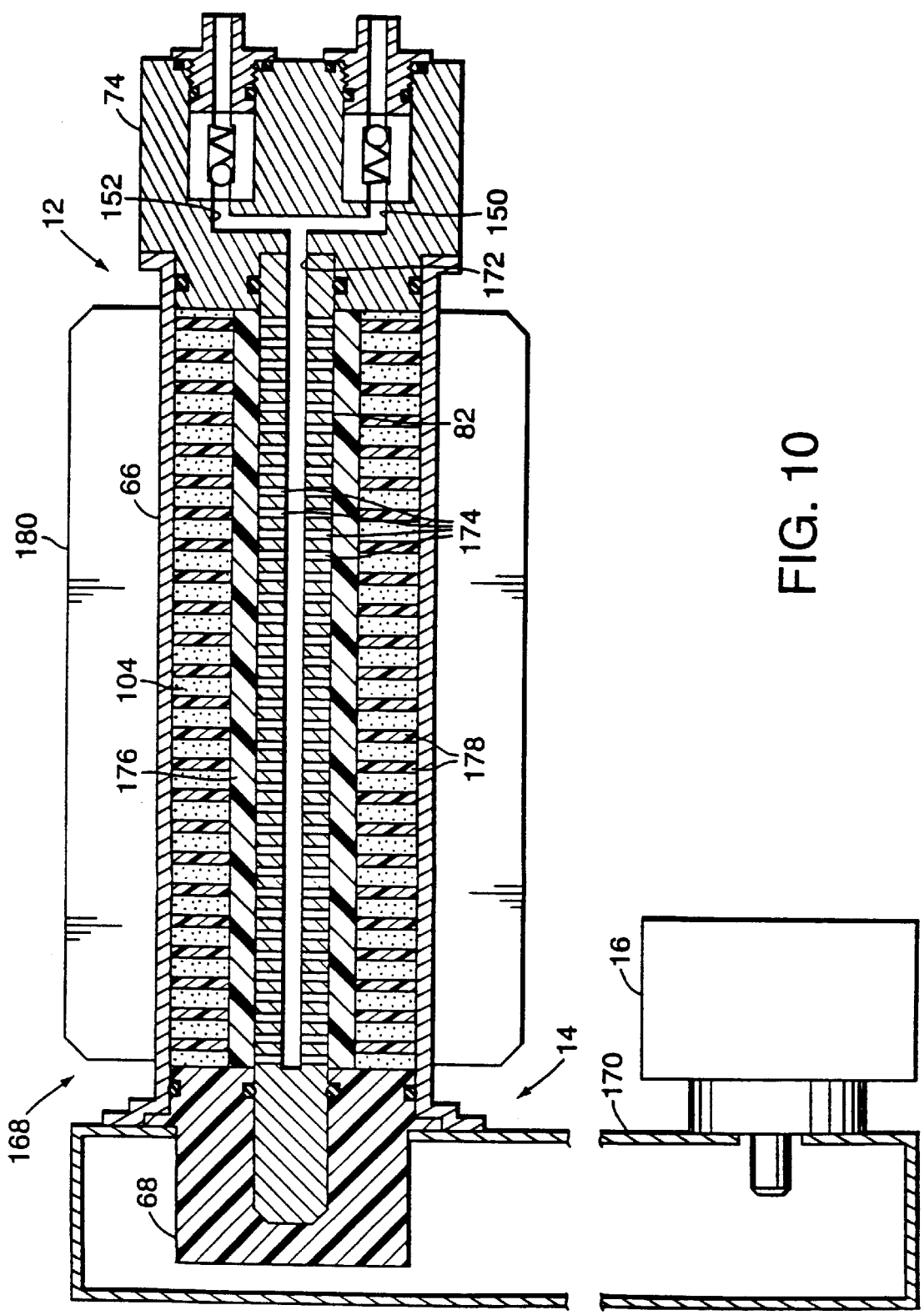
FIG. 10 is a longitudinal cross sectional view of a fifth embodiment of the coaxial applicator of the present invention.

A further embodiment of the waveguide applicator of the present invention is depicted in FIG. 10. In this embodiment, the waveguide applicator, indicated generally by reference number 168, comprises a sorber 12 having an outer conductor housing 66 and an inner conductor 82. The left end (as viewed in FIG. 10) of the inner conductor 82 extends into or through the end plug 68 and into a waveguide coupler 14 comprising a waveguide 170. The outer conductor 66 is connected directly to the waveguide 170. Electromagnetic waves from the magnetron 16 are thus coupled to the sorber 12 through the waveguide 170.

In this embodiment, the inlet and outlet ports 150, 152 in end cap 74 are connected to an axial bore 172 extending most of the way through the inner conductor 82. Bore 172 is connected to a plurality of radial bores 174 formed in inner conductor 82 to communicate the sorbate through a filter sleeve 176 to the sorbent 104. The filter sleeve 176 may be a perforated Polyethylene cylinder. The sorbent 104 is positioned adjacent the outer conductor 66, and a plurality of non-metallic fins or discs, made of Teflon for example, may be provided to reduce the mass flow and thermal diffusion path lengths of the sorbent 104. In addition, longitudinal fins 180 may be connected to the outer conductor 66 to help dissipate the heat of desorption.

FIGS. 11 and 12 illustrate embodiments of the present invention wherein the inner conductor is inserted transversely into the outer conductor. The waveguide applicator shown in FIG. 11, indicated generally at 182, includes a sorber 12 having an outer conductor housing 66 and a T-shaped inner conductor 82. Inner conductor 82 includes a transverse stem 184 which extends through a plug 186 secured in an opening 188 formed in the outer conductor 66. In this embodiment, the left end 190 and the right end 192 of the inner conductor are short circuited with the outer conductor 66 through respective metallic end caps 74 and the stem 184 is coupled to a source of electromagnetic waves via a suitable waveguide coupler (not shown).

The waveguide applicator of FIG. 12, which is indicated generally by reference number 194, is similar to waveguide applicator 182. However, in this embodiment the ends 190, 192 of the inner conductor 82 are not short circuited to the outer conductor 66. Rather, the ends are terminated a predetermined distance from the metallic end caps 74. This distance and the dimensions of the inner and outer conductors 82, 66 are specifically designed to create a resonant cavity within the sorber 12 using standard microwave engineering techniques. The resulting standing electromagnetic wave may have an intensity greater than that which is achieved in the coaxial waveguide applicators of the previous embodiments, which generate traveling plane waves. In this embodiment, the ends 190, 192 of the inner conductor may be supported in non-metallic end plugs 68, and a suitable waveguide coupler 14, such as that described with reference to FIG. 8, is employed to couple the sorber 12 to an electromagnetic wave generator.

Figure 13:
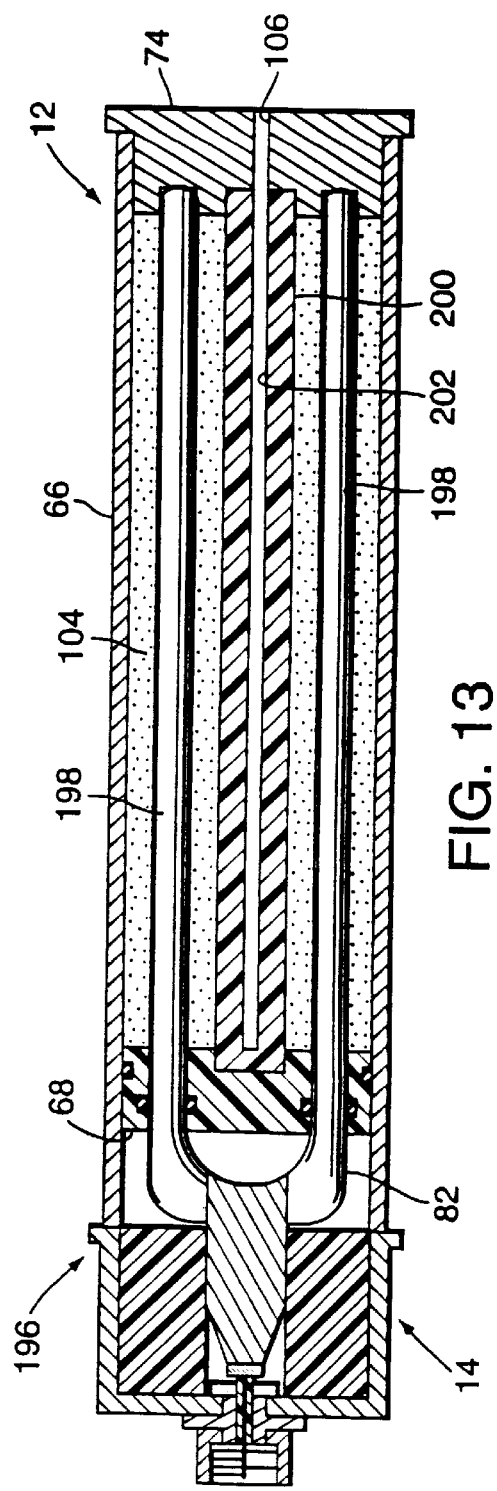
FIG. 13 is a longitudinal cross sectional view of an eighth embodiment of the coaxial applicator of the present invention.

Referring now to FIG. 13, a waveguide applicator 196 is shown which comprises a sorber 12 having an outer conductor housing 66 and an inner conductor 82 which includes multiple probes 198 extending through the sealed enclosure formed in the sorber 12. The multiple probes 198 allow the electromagnetic waves to be transmitted directly and propagated uniformly through the sorber 12. In this embodiment, the waveguide applicator 196 may include a gas inlet/outlet cylinder 200 supported between the end plug 68 and the end cap 74. The cylinder 200 preferably includes an axial bore 202 in alignment with the port 106. In addition, the cylinder 200 is preferably made of perforated Polyethylene or a similar material to permit the sorbate to be communicated to the sorbent 104 and to prevent the sorbent 104 from exiting the sorber 12 through port 106.

Figure 14:
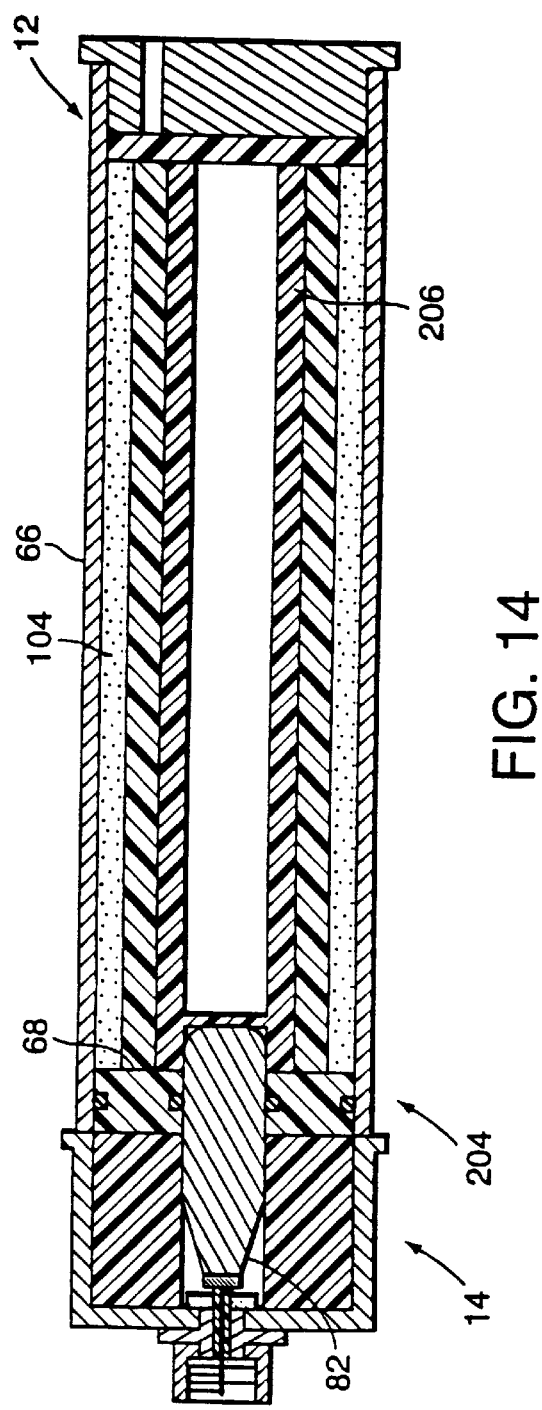
FIG. 14 is a longitudinal cross sectional view of a ninth embodiment of the coaxial applicator of the present invention.

In the embodiment depicted in FIG. 14, the waveguide applicator 204 also includes a sorber 12 having an outer conductor housing 66. However, in this embodiment the inner conductor 82 is designed to extend only a predetermined amount into the inner conductor. This results in the electromagnetic waves being broadcast through the sorber 12 in a transverse magnetic wave pattern. The distance that the inner conductor extends into the outer conductor is selected to be a multiple of one-quarter wavelength of the operating frequency. A suitable waveguide coupler 14 is provided to couple the inner and outer conductors 82, 66 to an electromagnetic wave generator. Conventional radio frequency design techniques, including for example numerical modeling methods, are preferably employed to determine the ideal dimensions of the sorber 12 in this embodiment of the invention.

In this embodiment, a support sleeve 206 may be provided to support the inner conductor 82 and displace the salt 104 toward the outer conductor 66. The support sleeve is constructed of a material which will not interfere with the transmission of the electromagnetic waves, such as Teflon.

Figure 15:
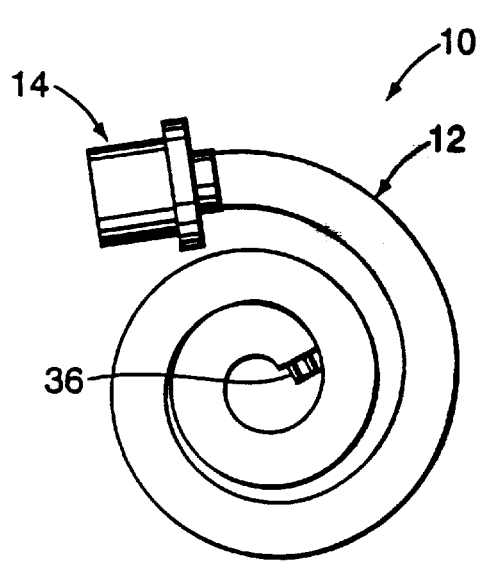
FIG. 15 is a plan view of another embodiment of the coaxial applicator of the present invention.
Figure 16:
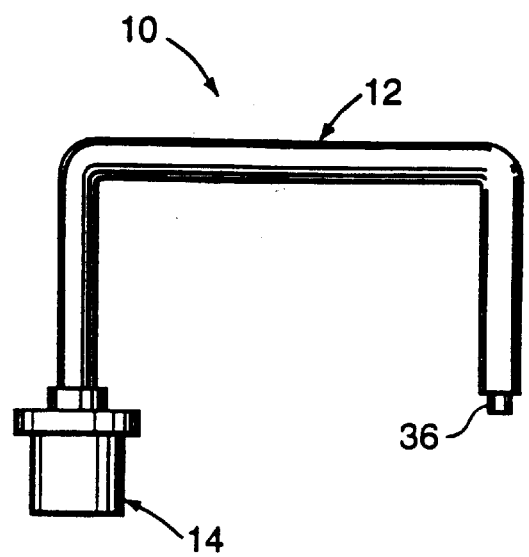
FIG. 16 is a plan view of yet another embodiment of the coaxial applicator of the present invention.

Referring now to FIGS. 15 and 16, the coaxial waveguide applicator 10 of the present invention may take many configurations. Thus, the sorber 12 may be coiled (as shown in FIG. 15) or otherwise bent (as shown in FIG. 16). In addition, since the housing of the sorber 12 must be strong enough to maintain the internal pressures generated during the desorption reactions, the sorber 12 may form a structural component of an apparatus incorporating the sorption system of the present invention. Furthermore, provided a sufficiently strong outer conductor is provided and the required electrical configuration is maintained, the sorber 12 may be implemented in a flexible housing.

The sorption system of the present invention is particularly suited for cooling electrical components in computing and superconducting applications. Depending on the cooling requirements, the above teachings can be applied in the determination of an appropriate electromagnetic wave generator, the design of a waveguide applicator, and the selection of suitable sorbates and sorbents. While the embodiments of the coaxial waveguide applicator 10 described above may be used in such a refrigeration sorption system, other waveguide applicators may be derived from the above teachings to meet particular requirements.

Figure 17:
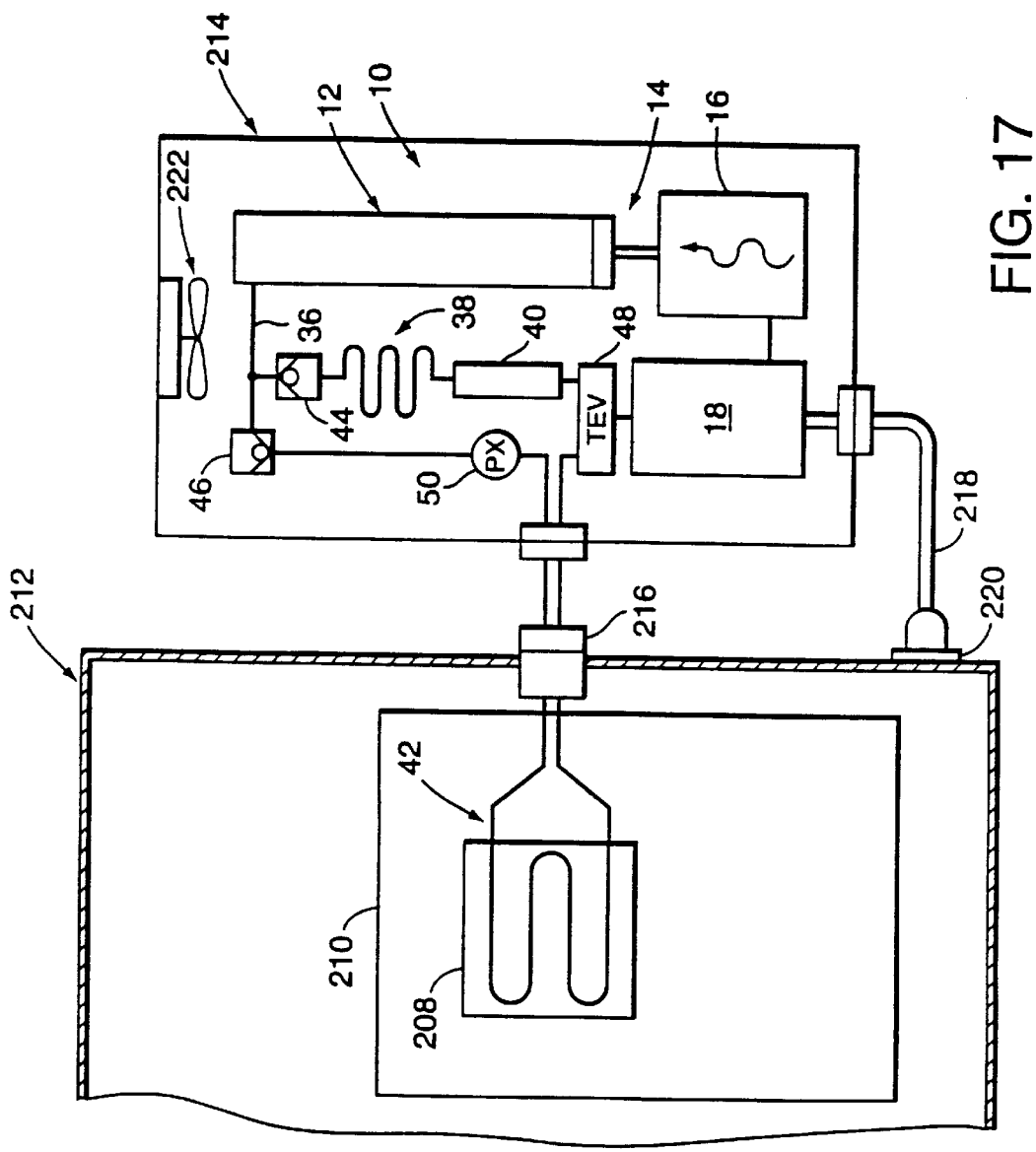
FIG. 17 is a top plan view of a refrigeration sorption system of the present invention specially adapted for use in cooling electrical components.

Referring now to FIG. 17, a refrigeration sorption system for cooling, for example, a microprocessor 208 mounted on the motherboard 210 of a computer 212 is shown. The refrigeration sorption system of this embodiment may be located in a housing 214 separate from the computer 212 and preferably comprises many of the elements described with reference to FIGS. 1 and 1A. Thus, the sorption refrigeration system includes a power circuit 18 for controllably activating an electromagnetic wave generator 18 which is coupled to a sorber 12 of a waveguide applicator 10 by a suitable waveguide coupler 14. In this embodiment, an appropriately designed evaporator 42 is mounted or attached to the microprocessor 208 and is connected through the cabinet of the computer 212 to the housing 214 through a suitable pressure coupling 216. Power for operating the refrigeration sorption system may be provided over a cable 218 which is connected to a suitable power source, for example a standard socket 220 located on the computer 212. In addition, a fan 222 may be provided to help dissipate the heat of adsorption from the sorber 12 and the heat of condensation from the condenser 38.

Figure 18:
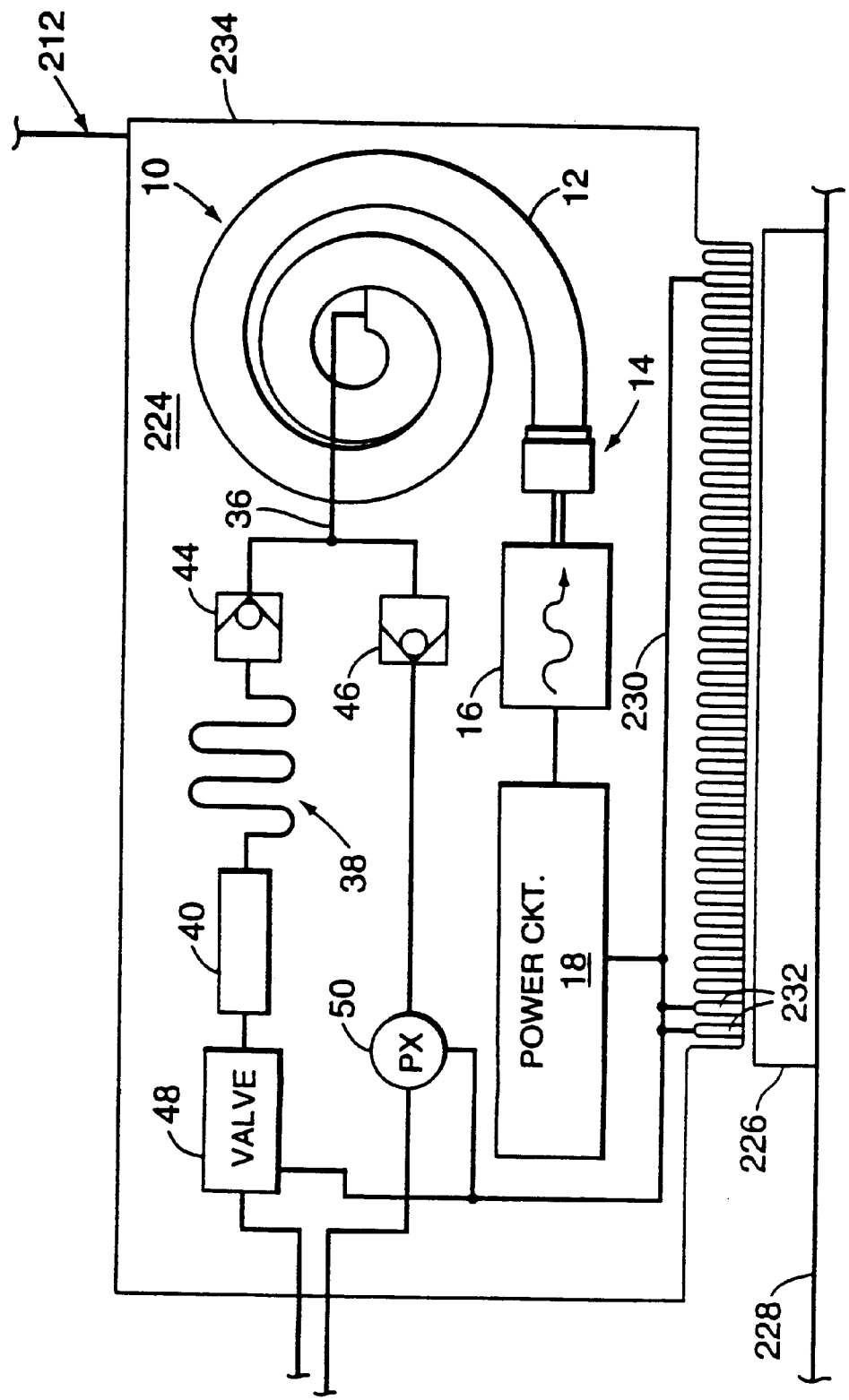
FIG. 18 is a plan view of another embodiment of the refrigeration sorption system depicted in FIG. 17.

The refrigeration sorption system may also be located inside the computer or other apparatus containing electrical components to be cooled. With reference to FIG. 18, the refrigeration sorption system is shown mounted on a PC board 224 which may be plugged into an expansion slot 226 connected to the system bus 228 of the computer 212. As in the previous embodiment, the refrigeration sorption system shown in FIG. 18 comprises many of the same components depicted in FIGS. 1 and 1 1A. The components are mounted to the board 224 using conventional techniques, and the elements of the power circuit 18 and the electromagnetic wave generator 16 are preferably interconnected via the conductive tracings on the board 224.

While the power circuit 18 may be substantially as described with reference to FIG. 1A, control of the operation of the refrigeration sorption system of FIG. 18 may be provided through the main microprocessor of the computer 212. In addition, the power required to operate the refrigeration sorption system may be obtained from the computer 212. The system accordingly preferably includes a local bus 230 which is connected to the system bus 228 and power supply of the computer 212 through conductors 232 and the expansion slot 226. The power circuit 18 includes conventional voltage and current converting circuitry to convert the power from the computer 212 into the form required by the electromagnetic wave generator 16, and the components of the power circuit 18, as well as the valve 48 and the pressure sensor 50, if required, are preferably connected to the local bus 230.

Furthermore, although the condenser 38 is shown mounted on a portion of the PC board located inside the computer 212, the condenser may be mounted on the rear edge 234 of the PC board, which is exposed externally of the cabinet of the computer 212 when the PC board 214 is mounted in the computer 212. In this manner, any heat dissipated by the condenser 38 will not be communicated to the electrical components inside the computer 212. Similarly, the sorber 12 may be mounted outside of the cabinet of the computer 212 so that the heat of adsorption will not be communicated to the electrical components.

Figure 19:
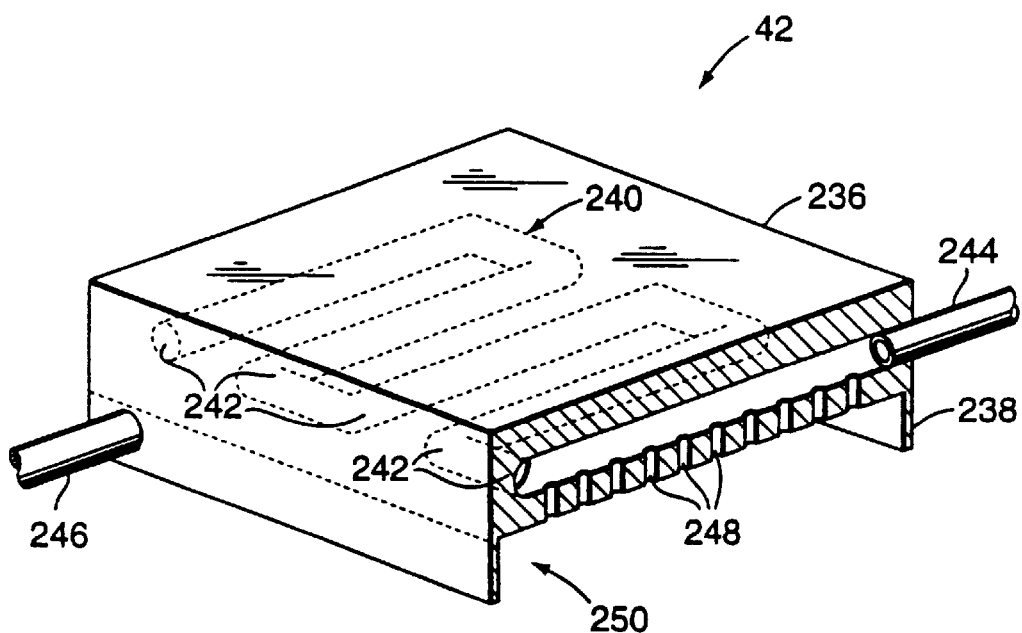
FIG. 19 is a cross-sectional perspective view of an evaporator constructed in accordance with the present invention which is useful with the refrigeration sorption systems described beginning with FIG. 17.

Referring to FIG. 19, an evaporator 42 which is especially adapted for use in cooling electrical components is shown. The evaporator 42 comprises a housing 236 having a depending shroud 238 adapted to be positioned over and secured to the electrical component to be cooled (not shown). A manifold 240 comprising preferably several interconnecting branches 242 is formed in housing 236 above the shroud 238. The manifold 240 is connected to the condenser 38 and the sorber 12 of the refrigeration adsorption system (not shown) by an inlet line 244 and an outlet line 246, respectively. A plurality of preferably capillary-size holes 248 are formed in the housing 236 to connect the manifold 240 to the space 250 encompassed by the shroud 238 and the electrical component to which the evaporator 42 is attached.

In operation of evaporator 42, a liquid sorbate refrigerant will enter the manifold 240 through inlet 244 and be discharged into space 250 through holes 248. The liquid sorbate will evaporate in space 250 and absorb the heat generated by the electrical component, thereby cooling the component. The evaporated sorbate will then be drawn through outlet 246 and back to the sorber 12.

Figure 20:
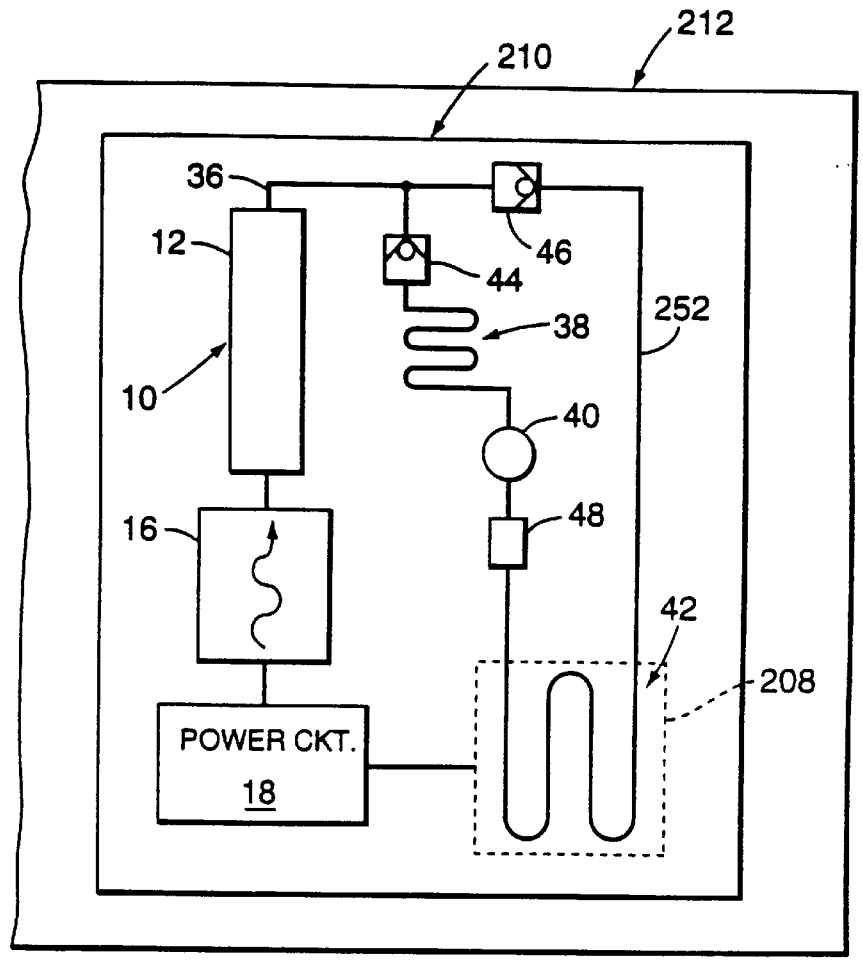
FIG. 20 is a top plan view of yet another embodiment of a refrigeration sorption system of the present invention specially adapted for use in cooling electrical components.

Referring to FIG. 20, the refrigeration sorption system is shown mounted directly to the motherboard 210 of the computer 212. In this embodiment, the evaporator 42 may be positioned beneath the microprocessor 208 (depicted in phantom) or etched directly into the substrate of the motherboard 210. The sorbate flow line 252 may be etched directly into the substrate of the motherboard 210 using conventional techniques. In addition, the check valves 44, 46, as well as the flow control valve 48, may be micromechanical devices which are also etched into the substrate. In this manner, the refrigeration sorption system depicted in FIG. 20 may occupy a relatively small portion of the motherboard 210. Alternatively, many of the components of the refrigeration sorption system, such as the valves and the waveguide applicator, may be placed on a separate integrated circuit chip which is mounted to the motherboard 210 and connected to the other components of the refrigeration sorption system by appropriate means.

Figure 21:
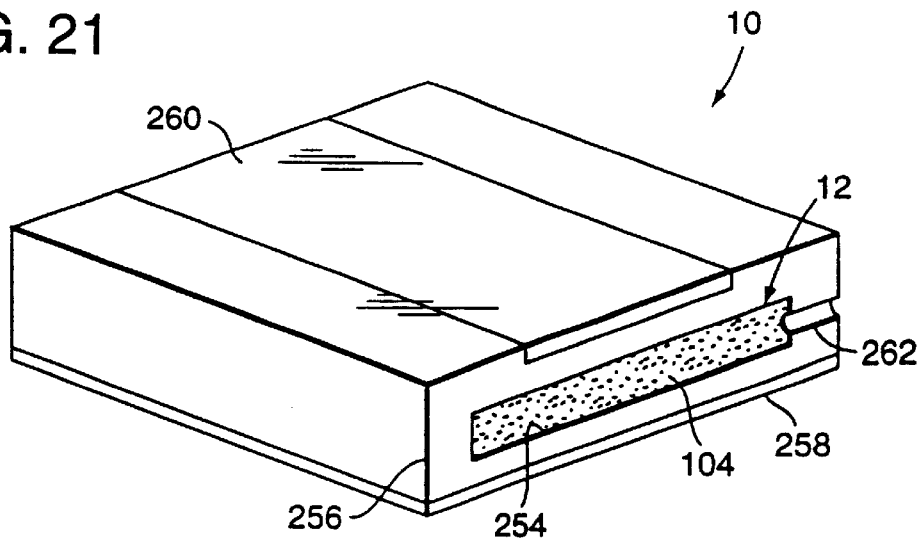
FIG. 21 is a cross-sectional perspective view of a sorber constructed in accordance with the present invention which is useful with the embodiments depicted in FIGS. 17, 18 and 20.

A waveguide applicator 10 suitable for use in any of the previous embodiments is depicted in FIG. 21. In this embodiment, the waveguide applicator 10 is implemented using stripline, or microstrip, technology, such as discussed in the textbook *Practical RF Power Design Techniques* by Irving M. Gottlieb (TAB Books, 1993). The sorber 12 is formed by etching a chamber 254 directly into a circuit board substrate 256 and then sealing the chamber to define a pressure tight enclosure. Prior to sealing the enclosure, the sorbent 104 is placed in the chamber 254. Electromagnetic waves are transmitted to the sealed enclosure and propagated through the sorbent 104 via a ground plane conductor 258 positioned on one side of the enclosure and a stripline conductor 260 positioned on a side of the enclosure opposite the ground plane conductor 258. The ground plane conductor 258 and the stripline conductor 260 are preferably coupled to the electromagnetic wave source by striplines (not shown). The sorbate is communicated to the sorbent through a port 262 formed in the substrate, and a suitable filter may be provided to prevent the sorbent 104 from exiting the sealed enclosure through port 262. Alternatively, any suitable solid sorbent may be used, in which event a filter would not be required.

Figure 22:
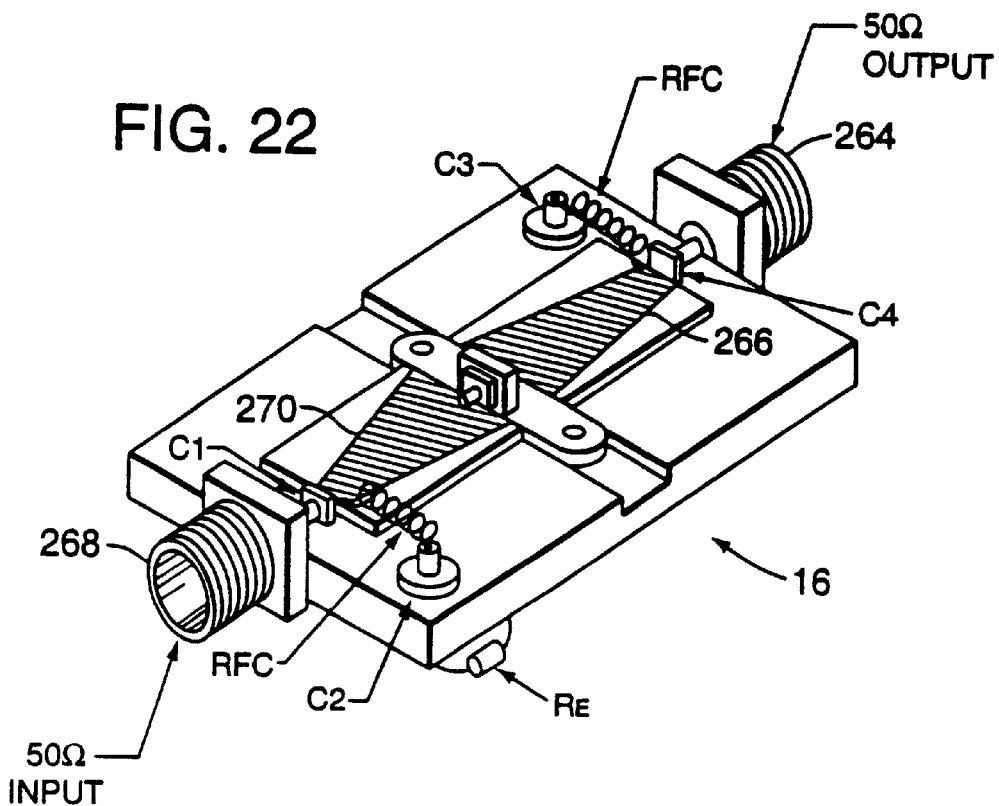
FIGS. 22 and 22A are perspective and schematic views, respectively, of an example of an electromagnetic wave generator which is useful with the present invention.
Figure 22A:
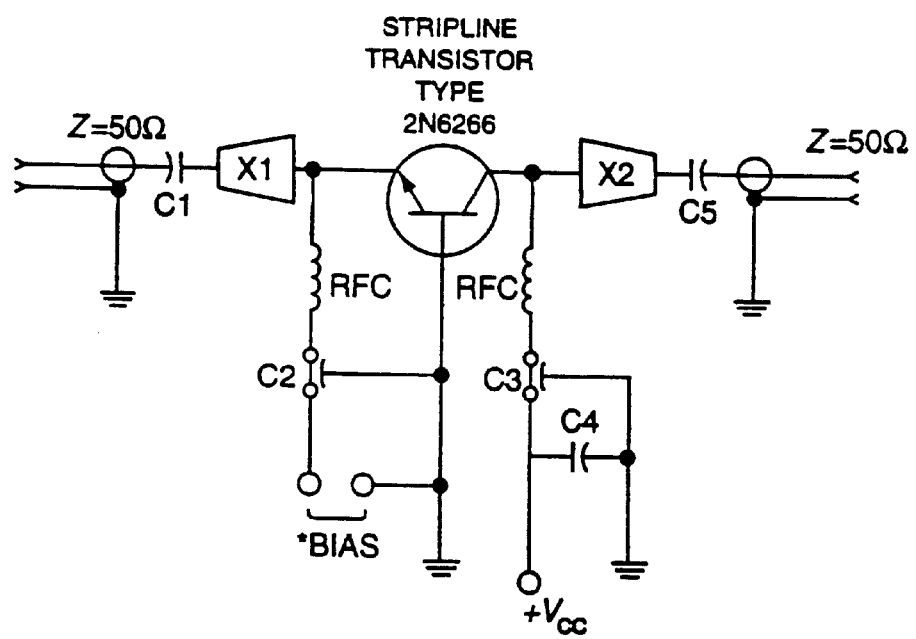

Although a microwave tube such as a magnetron may be a suitable electromagnetic wave generator for the refrigeration sorption systems depicted above, various solid state oscillator devices may also be employed. One example of such a solid state electromagnetic wave generator 16 is the stripline microwave amplifier circuit depicted in FIGS. 22 and 22A. This microwave amplifier, which is discussed in detail in the *Practical RF Power Design Techniques text*, comprises appropriate components to generate between 6 and 13 Watts of power. In this embodiment, a 28 Volt D.C. power supply is connected as shown in FIG. 22A, and the resulting radio frequency waves are coupled to the sorber (not shown) via a coaxial output connector. Alternatively, the output stripline 266 may be coupled directly to, for example, the stripline conductor 260 in the sorber depicted in FIG. 21. The input connector 268 or input line 270 may be connected to another oscillator, in which event the stripline microwave amplifier would function to amplify the input wave.

Figure 23:
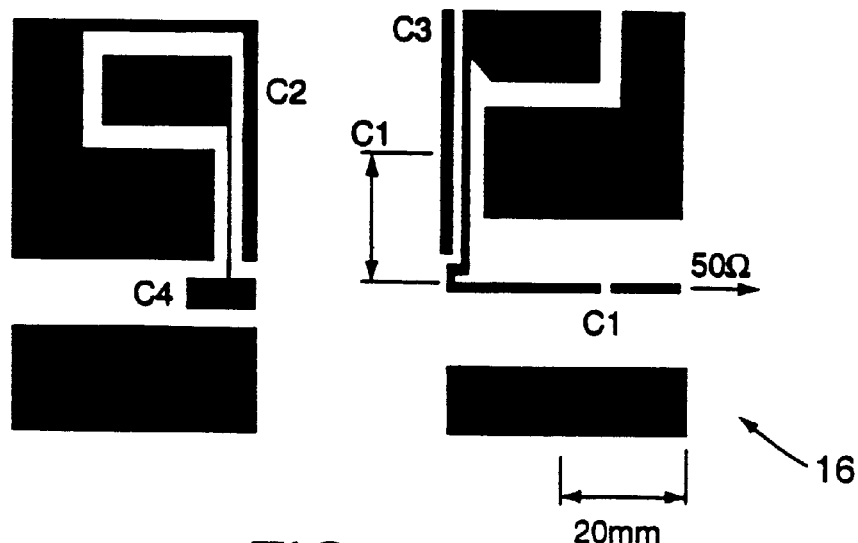
FIGS. 23 and 23A are perspective and schematic views, respectively, of another example of an electromagnetic wave generator which is useful with the present invention.
Figure 23A:
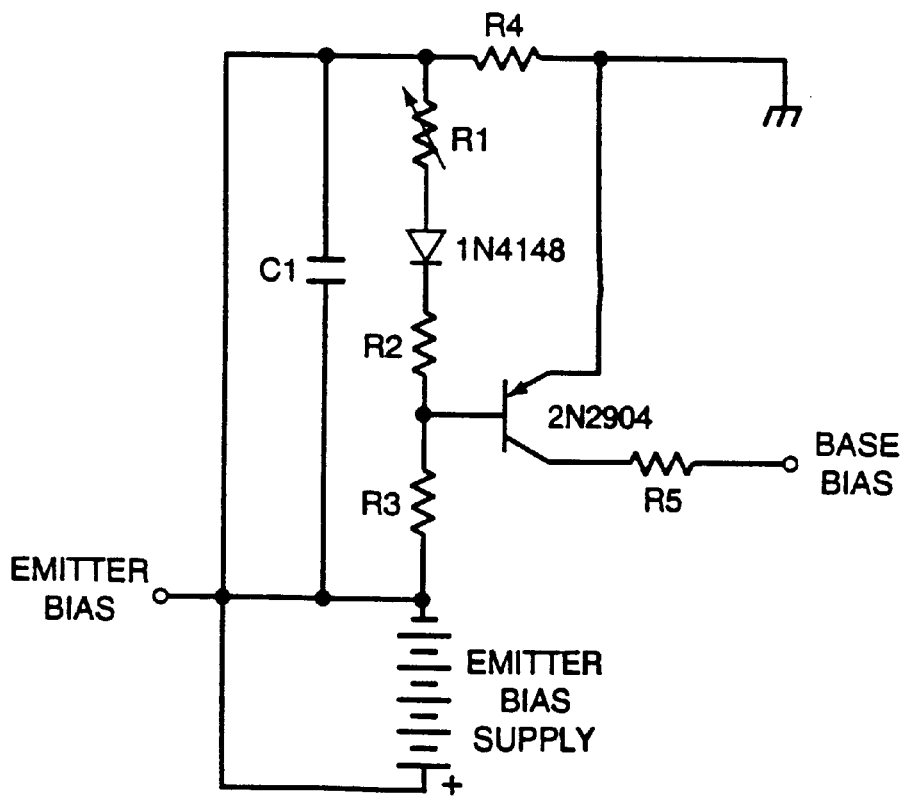

Another exemplary electromagnetic wave generator 16 is shown in FIGS. 23 and 23A. In this embodiment, a microwave oscillator is implemented using conductive tracings on a PC board, as discussed more thoroughly in the *Practical RF Power Design Techniques text*. This embodiment is particularly suited for the embodiments of the sorption system depicted in FIGS. 18 and 20 or in a sorption system that may be contained in a single integrated circuit.

Although not depicted in the Figures, it should be understood that the refrigeration sorption systems described with reference to FIGS. 17, 18 and 20 could include two or more sorbers 12. This would be the case where, for example, continuous cooling of an electrical component is required. Specific embodiments of such systems can readily be derived from the above teachings.

Figure 24:
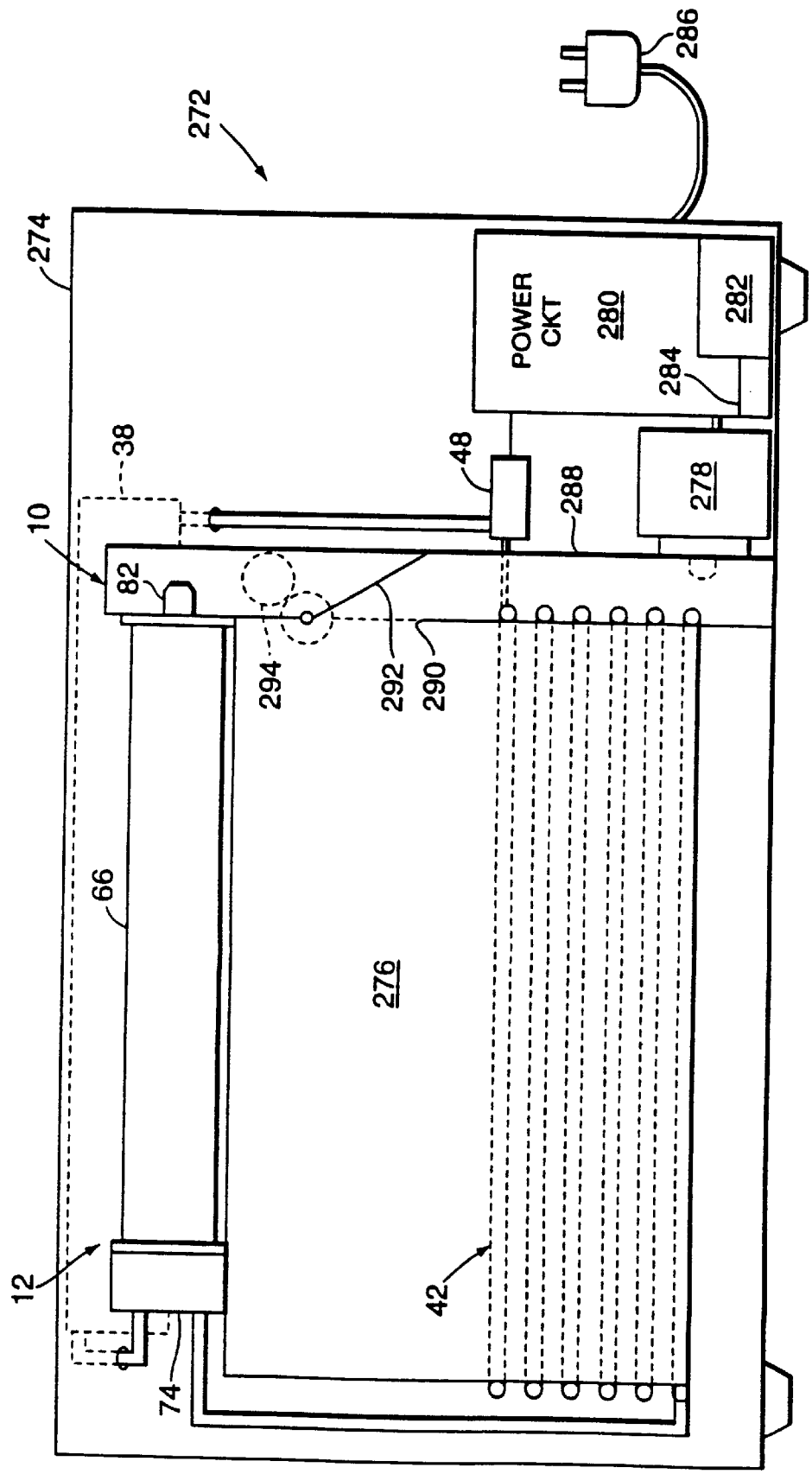
FIG. 24 is a plan view of an embodiment of a combination microwave cooking and cooling appliance of the present invention.

The refrigeration sorption system of the present invention may be ideally incorporated into conventional consumer appliances to provide any desired cooling effect. Referring to FIG. 24, the refrigeration sorption system is shown incorporated into a conventional microwave cooking appliance 272. Microwave appliance 272 includes a housing 274 having an insulated cooking compartment 276, a magnetron 278 and a power circuit 280 for supplying power to the magnetron 278. The magnetron 278 is typically a 900 W magnetron, and the power circuit 280 conventionally includes a microcontroller 282 for controlling the activation of the magnetron 278 in response to a timer 284 which may be set or programmed by a user. The power circuit 280 also usually includes a transformer (not shown) for converting standard household voltage communicated through a plug 286 into a form required by the magnetron 278 and the power circuit 280. In operation, microwaves from the magnetron 278 are transmitted via a waveguide 288 through a window 290 into the cooking compartment 276.

In accordance with the present invention, a waveguide applicator 10 similar to any of the previously described embodiments is mounted in cabinet 274, for example above cooking compartment 276. The waveguide applicator depicted in FIG. 24 includes a sorber 12 having an outer conductor housing 66 and an end cap 74 having integral check valves 44, 46 (which are not visible in FIG. 24). Waveguide applicator 10 also includes an inner conductor 82 which extends beyond the right end (as viewed in FIG. 24) of the outer conductor 66 Microwaves from magnetron 278 are coupled to the inner and outer conductors 82, 66 via the waveguide applicator 288. A pivotable metallic shutter 292 is movable to the position shown in phantom in FIG. 24 to close the window 29 and allow the microwaves to pass to the inner and outer conductors 82, 66.

In the embodiment depicted in FIG. 24, the output port of the sorber 12 is connected to a condenser 38, which is preferably located on the back of the microwave appliance 272 outside of cabinet 274. The output of the condenser 38 is connected through an optional sorbate receiver (not shown) to a TEV 48 or similar electrically-controlled valve. In this embodiment, microcontroller 282 is programmed to control the TEV 48 to selectively discharge the condensed sorbate into an evaporator 42 to produce the desired cooling effect. Evaporator 42 is shown surrounding a portion of the cooking compartment 276, but any other suitable configuration may be employed.

In practice, the refrigeration sorption system depicted in FIG. 24 is preferably designed using the above-discussed teachings to meet the most taxing cooling requirements contemplated by the manufacturer of the appliance. For example, the manufacturer may require that the system be able to freeze a specific volume of water in a specific amount of time.

In operation, microcontroller 282 is preferably programmed to desorb sorber 12 when the microwave appliance 272 is not being utilized for another purpose. Prior to beginning a desorption reaction, however, the microcontroller 282 ideally activates a motor 294 to close the shutter 292. Then, when cooling is required, the system is immediately ready to begin the adsorption reaction, which as discussed above corresponds to the cooling cycle in a single-sorber system.

Figure 25:
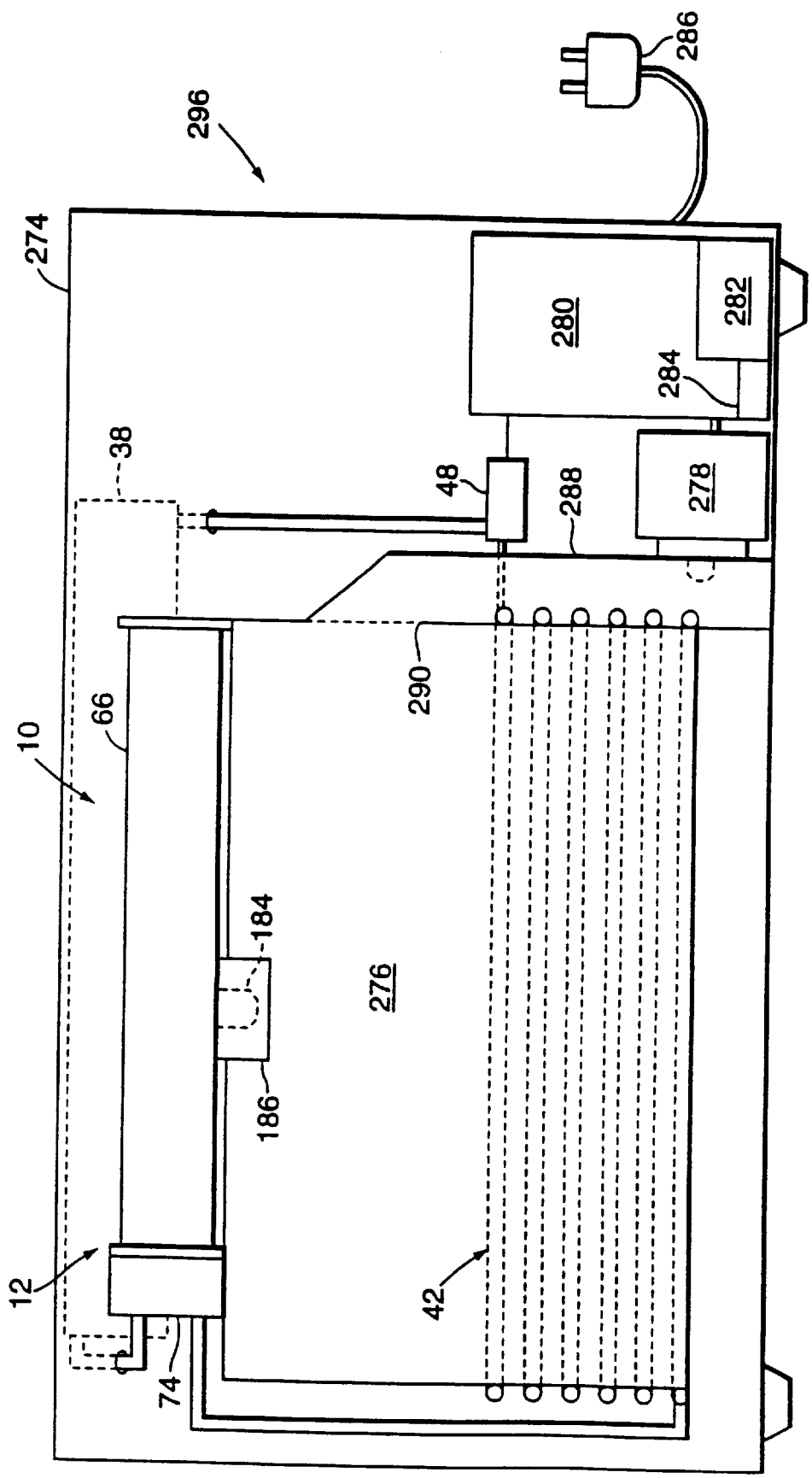
FIG. 25 is a plan view of another embodiment of a combination microwave cooking and cooling appliance of the present invention.

Referring now to FIG. 25, a combination microwave cooking and cooling appliance, which is indicated generally by reference number 296, is depicted which is similar in many respects to that described in the previous embodiment. However in the FIG. 25 embodiment, the waveguide applicator 10 described with reference to FIG. 11 is preferably employed. In this embodiment, the stem 184 of the inner conductor 82 extends into the cooking compartment 276. Thus, microwaves transmitted to the cooking compartment 276 are received by the inner conductor 82 and propagated through the sorber 12. In this manner, the sorber may be charged, or desorbed, while the appliance 296 is being used to heat food in compartment 276 and will therefore be immediately ready to begin a cooling cycle when required. Ideally, the dispersion of the microwaves in compartment 276 is estimated using numerical modeling techniques to determine the optimum size and location of stem 184.

Figure 26:
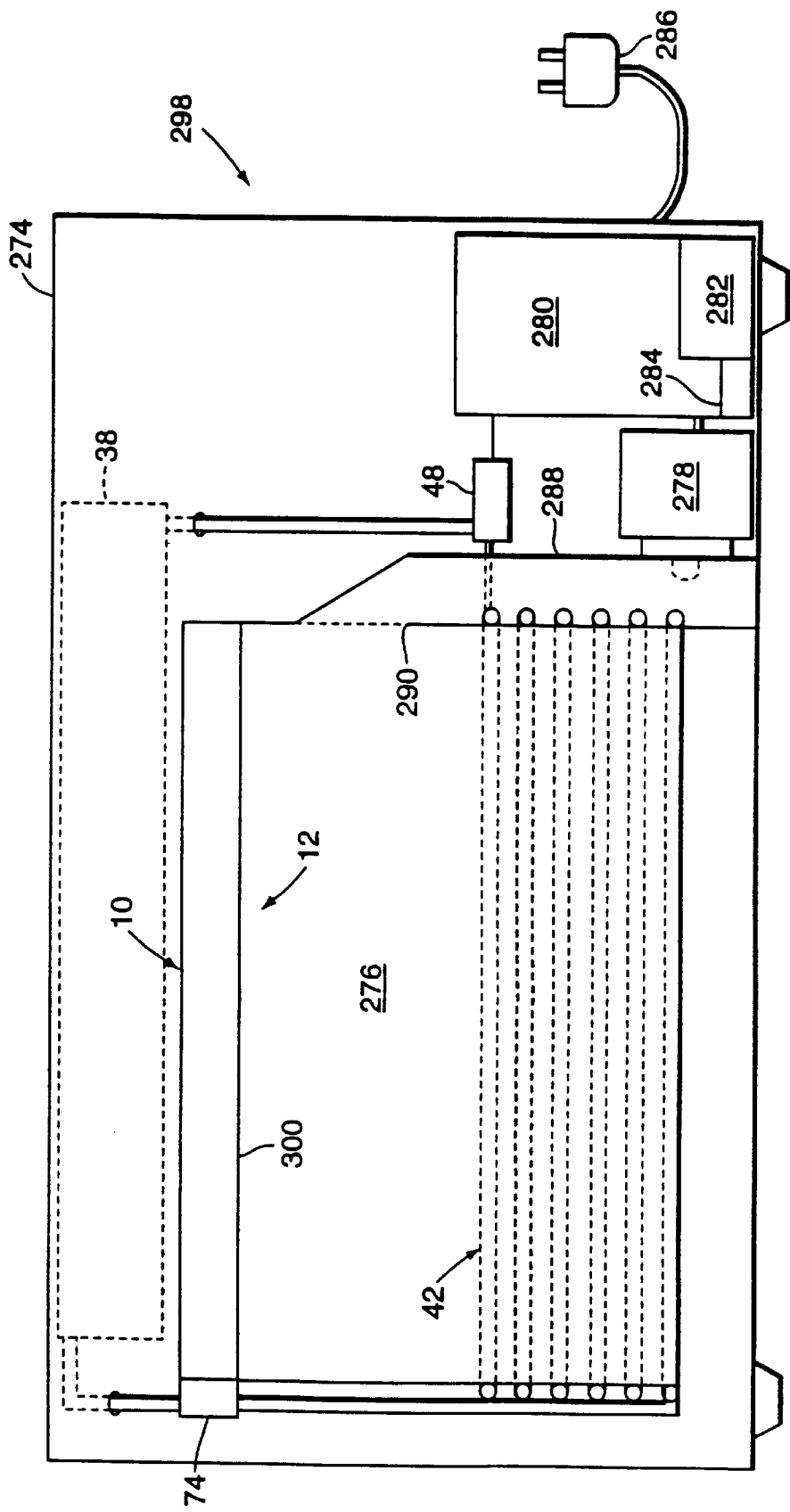
FIG. 26 is a plan view of yet another embodiment of a combination microwave cooking and cooling appliance of the present invention.

FIG. 26 illustrates yet another embodiment of a combination cooling and cooling appliance. The appliance of this embodiment, indicated at 298, is similar to those described in the previous embodiments. However, the waveguide applicator 10 of this embodiment comprises a sorber 12 having a non-metallic housing 300 which forms a sealed enclosure within sorber 12. Thus, sorber 12 does not have an outer conductor. However, waveguide applicator 10 does include an inner conductor, such as the inner conductor 82 illustrated in FIG. 4. Consequently, microwaves transmitted to the cooking compartment 276 will be received by the inner conductor and propagated through the sorber 12. The housing 300 is mounted within compartment 276 using any suitable means, and numerical modeling techniques are preferably used to determine the ideal shape and location of sorber 12.

Figure 27:
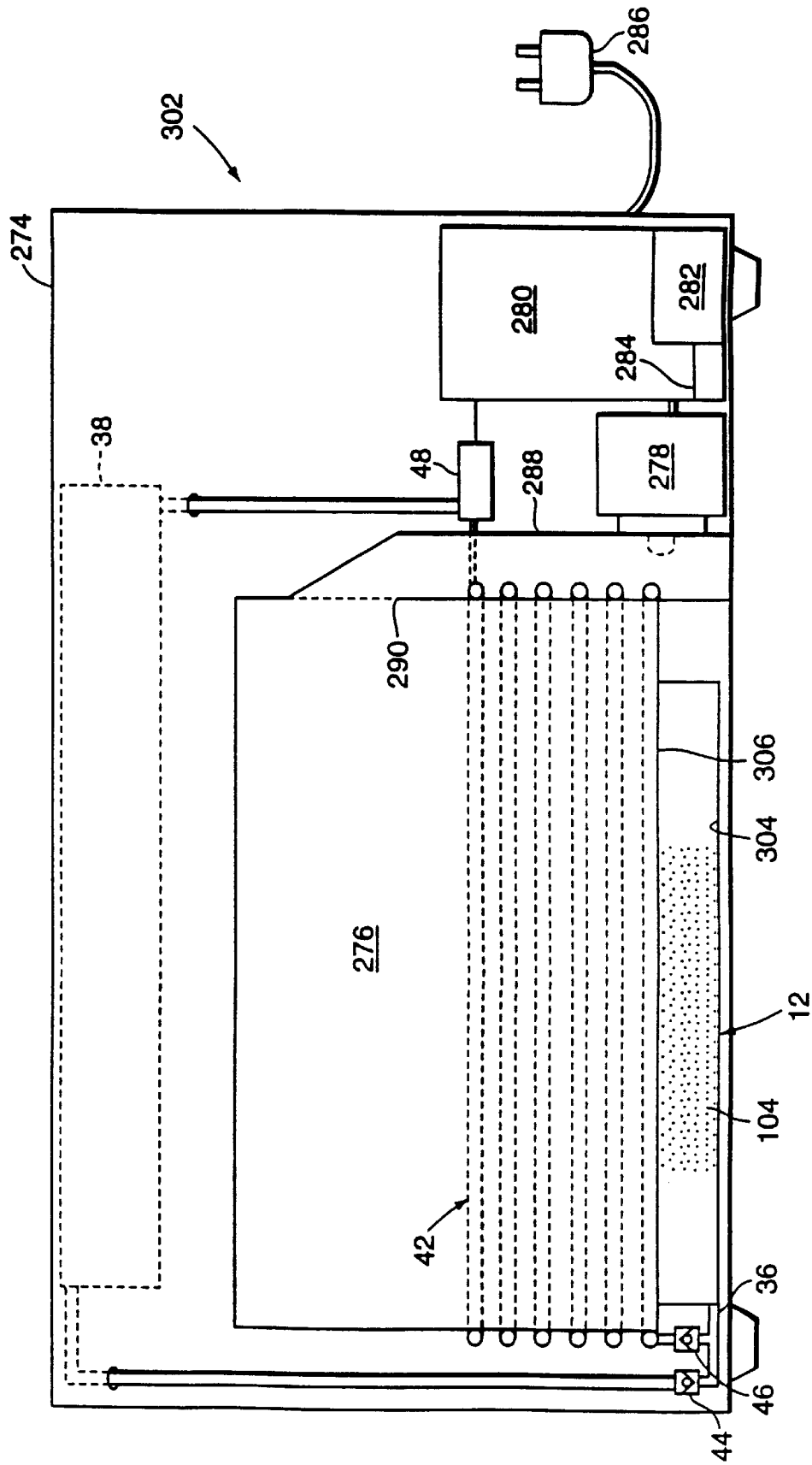
FIG. 27 is a plan view of still another embodiment of a combination microwave cooking and cooling appliance of the present invention.

Referring to FIG. 27, another embodiment of a combination cooking and cooling appliance is shown. Once again, the appliance of this embodiment, indicated generally by reference number 302, is similar in many respects to those of the previous embodiments. However, in this embodiment the sorber 12 is located in a chamber 304 formed in or connected to the cabinet 274 of the appliance 302. After the sorbent 104 is loaded into the chamber 304, a microwave-transparent cover 306 is secured over the chamber 304 to form a sealed enclosure within sorber 12. In addition, numerical modeling techniques are preferably employed to determine the optimum size, shape and location of chamber 304, which may comprise a plurality of interconnected smaller compartments.

From the above description, it should be apparent that other combination-type appliances may be constructed using the teachings of the present invention. Thus, a refrigerator appliance may be designed which includes conventional cooling and freezing compartments and an ice maker which operates to provide ice on demand in a manner described in Example 3 above. In addition, a refrigerator appliance may be designed which includes these components and also a microwave cooking chamber, all powered from a single magnetron or other source of electromagnetic waves. Furthermore, non-household appliances may be designed using the teachings of the present invention. For example, a vending machine that is capable of serving both warm and chilled items may be constructed which incorporates the inventive refrigeration sorption system described above and a conventional microwave heater, both activated using the same magnetron.

It should therefore be recognized that, while the present invention has been described in relation to the preferred embodiments thereof, those skilled in the art may develop a wide variation of structural and operational details without departing from the principles of the invention. For example, the various components illustrated in the different embodiments may be combined in a manner not illustrated above. Therefore, the appended claims are to be construed to cover all equivalents falling within the true scope and spirit of the invention.

What is claimed is:

1. An evaporator for use in an apparatus for cooling an electrical component, the evaporator comprising:

an evaporator housing having a depending shroud adapted to be positioned over the electrical component;

a manifold located in the evaporator housing above the shroud;

a plurality of holes connecting the manifold with a space encompassed by the shroud;

an inlet for providing fluid communication between the manifold and the exterior of the evaporator housing; and an outlet for providing fluid communication between the space and the exterior of the evaporator housing.

2. The apparatus of claim 1, wherein the manifold comprises a plurality of interconnecting branches.

3. The apparatus of claim 1, wherein the holes are preferably approximately 0.004 to 0.030 inch in diameter.

* * * * *